United States Patent
Reidy et al.

(10) Patent No.: US 11,119,320 B2
(45) Date of Patent: Sep. 14, 2021

(54) FRINGE MITIGATION USING SHORT PULSED LASER DIODES

(71) Applicant: MICROSOFT TECHNOLOGY LICENSING, LLC, Redmond, WA (US)

(72) Inventors: Christopher Francis Reidy, Bellevue, WA (US); Shiva Shahin, Bellevue, WA (US); Kai Zang, Redmond, WA (US); Raymond Kirk Price, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 343 days.

(21) Appl. No.: 16/229,969

(22) Filed: Dec. 21, 2018

(65) Prior Publication Data

US 2019/0372306 A1 Dec. 5, 2019

Related U.S. Application Data

(60) Provisional application No. 62/680,627, filed on Jun. 5, 2018.

(51) Int. Cl.
*H01S 5/042* (2006.01)
*G02B 27/01* (2006.01)
(Continued)

(52) U.S. Cl.
CPC ....... *G02B 27/0172* (2013.01); *G02B 6/0016* (2013.01); *G02B 6/0036* (2013.01);
(Continued)

(58) Field of Classification Search
CPC .... H01S 5/0428; H01S 5/4093; H01S 5/4012; H01S 5/06216; H01S 2301/02;
(Continued)

(56) References Cited

U.S. PATENT DOCUMENTS

| 9,341,850 B1* | 5/2016 | Cakmakci | G02B 27/4216 |
| 2003/0174255 A1* | 9/2003 | Lee | H04N 9/3129 348/744 |

(Continued)

FOREIGN PATENT DOCUMENTS

| EP | 2426545 A1 | 3/2012 |
| JP | 2001189520 A | 7/2001 |
| WO | 2009088453 A2 | 7/2009 |

OTHER PUBLICATIONS

"International Search Report and Written Opinion Issued in PCT Application No. PCT/US2019/033637", dated Sep. 3, 2019, 13 Pages.

*Primary Examiner* — Balram T Parbadia
(74) *Attorney, Agent, or Firm* — Workman Nydegger

(57) ABSTRACT

Systems and methods are provided for controlling and/or modifying operation of a red, green, blue (RGB) laser assembly for creating images in mixed-reality environments. Initially, the lasers in the RGB laser assembly operate in a low power or non-emitting state. Then, the lasers emit laser light to illuminate a pixel or a group of pixels. This illumination occurs for a period of time spanning less than 15 nanoseconds. By causing the lasers to emit laser light only during this short period of time, the resulting laser light is structured with a reduced spatial coherence level. Once the time period elapses, then the lasers again return to the non-emitting state. This process repeats for each pixel such that the lasers generate pulsed emissions. By operating the lasers with a reduced spatial coherence, undesired visual artifacts can be reduced or eliminated within the target display area.

20 Claims, 20 Drawing Sheets

(51) Int. Cl.
  *G02B 26/10* (2006.01)
  *G02B 26/08* (2006.01)
  *F21V 8/00* (2006.01)
  *H01S 5/40* (2006.01)
  *H01S 5/00* (2006.01)

(52) U.S. Cl.
  CPC ......... *G02B 26/0833* (2013.01); *G02B 26/10* (2013.01); *H01S 5/0428* (2013.01); *H01S 5/4012* (2013.01); *H01S 5/4093* (2013.01); *G02B 2027/0147* (2013.01); *G02B 2027/0174* (2013.01); *H01S 5/005* (2013.01)

(58) Field of Classification Search
  CPC ........ H01S 5/0652; H01S 5/005; H01S 5/042; H04N 9/3161; H04N 9/3158; H04N 9/3129; H04N 9/3164; G02B 26/10; G02B 27/0172; G02B 26/0833; G02B 6/0036; G02B 6/0016; G02B 2027/0147; G02B 2027/0174; G02B 6/00; G02B 2027/0118; G02B 2027/0178; G02B 27/48
  See application file for complete search history.

(56) References Cited

U.S. PATENT DOCUMENTS

| | | | |
|---|---|---|---|
| 2003/0206248 A1* | 11/2003 | Childers | H04N 5/7416 |
| | | | 348/745 |
| 2011/0013245 A1 | 1/2011 | Tanaka et al. | |
| 2012/0044279 A1* | 2/2012 | Uchino | H04N 9/3129 |
| | | | 345/690 |
| 2012/0140784 A1 | 6/2012 | Quirk et al. | |
| 2017/0010473 A1* | 1/2017 | Ide | G02B 30/40 |
| 2017/0153319 A1* | 6/2017 | Villeneuve | G01S 7/4804 |

* cited by examiner

FRINGE MITIGATION USING SHORT PULSED LASER DIODES

This application claims the benefit of and priority to U.S. Provisional Patent Application Ser. No. 62/680,627 filed on Jun. 5, 2018 and entitled "FRINGE MITIGATION USING SHORT PULSED LASER DIODES," which application is expressly incorporated herein by reference in its entirety.

BACKGROUND

Mixed-reality systems, including virtual-reality (VR) and augmented-reality (AR) systems, have received significant attention because of their ability to create truly unique experiences for their users. For reference, conventional VR systems create a completely immersive experience by restricting their users' views to only virtual environments. This is often achieved through the use of a head-mounted device (HMD) that completely blocks any view of the real world. As a result, a user is entirely immersed within the virtual environment. In contrast, conventional AR systems create an augmented-reality experience by visually presenting holograms that are placed in or that interact with the real world.

As used herein, VR and AR systems are described and referenced interchangeably. Unless stated otherwise, the descriptions herein apply equally to all types of mixed-reality systems, which (as detailed above) include AR systems, VR systems, and/or any other similar system capable of displaying holograms.

Some of the disclosed mixed-reality systems use one or more on-body devices (e.g., the HMD, a handheld device, etc.). The HMD provides a display that enables a user to view overlapping and/or integrated visual information (e.g., holograms) in whatever environment the user is in, be it a VR environment, an AR environment, or any other type of environment. Continued advances in hardware capabilities and rendering technologies have greatly improved how mixed-reality systems render holograms. Notwithstanding these advances, the process of immersing a user into a mixed-reality environment creates many challenges, difficulties, and costs, particularly with regard to providing a high-quality hologram or holographic image to the user.

For instance, methodologies are in place to use a red, green, blue (RGB) laser assembly to visually project an image for the user to view in a mixed-reality environment/scene. As will be described in more detail later on, however, certain imperfections due to laser coherence effects, such as "artifacts," can appear in the images as a result of using a RGB laser. Such imperfections can negatively impact the user experience.

In view of the foregoing, there is currently a need to improve the manner in which images are projected into mixed-reality environments with RGB lasers.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

Disclosed embodiments are directed to systems and methods for controlling and/or modifying operation of a red, green, blue (RGB) laser assembly used for creating images in mixed-reality environments.

Some embodiments are directed to method acts and systems that initially identify a set of pixels that are to be irradiated by the RGB laser assembly. Subsequently, these pixels are irradiated with pulsed laser light in the following manner. Initially, the RGB laser assembly is configured to operate below a particular laser threshold such that it refrains from irradiating any pixels. Then, the RGB laser assembly is energized so that it operates above the laser threshold and so that it irradiates at least one pixel with laser light. This irradiation occurs only for a selected period of time lasting no longer than 15 nanoseconds. Furthermore, the intensity of the laser light is set to not exceed a pre-determined optical power level. Thereafter, the RGB laser assembly is again caused to operate below the laser threshold so that it again refrains from irradiating any pixels.

In some embodiments, a certain set of pixels are selected to be irradiated with RGB laser light. As such, a RGB laser assembly is selectively pulsed by energizing the RGB laser assembly with electrical current for a pre-selected period of time lasting no longer than 15 nanoseconds. As a result of this operation, the RGB laser assembly emits laser light having a spectral linewidth that satisfies a pre-selected spectral linewidth threshold. Subsequently, the pixels are irradiated with this specially structured laser light.

In some embodiments, a RGB laser assembly is selectively pulsed for a pre-selected period of time lasting no longer than 15 nanoseconds. Additionally, the RGB laser assembly emits structured laser light having a number of Fabry-Perot modes that is greater in number than laser light that is emitted for longer than 15 nanoseconds. Consequently, the spectral linewidth of the structured laser light exceeds a pre-selected width threshold. Then, a set of pixels are irradiated with this structured laser light.

In some instances, the disclosed embodiments can be used to help omit or reduce the occurrence of visual artifacts.

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which:

FIG. 2 also shows that regardless of the number of modes, laser light has a spectral linewidth.

DETAILED DESCRIPTION

Disclosed embodiments are directed to systems and methods for controlling and/or modifying operation of a red, green, blue (RGB) laser assembly used for creating images in a mixed-reality environment. In some embodiments, the disclosed embodiments can be used to help improve image quality of rendered images over corresponding images created by conventional systems and that omit or reduce the occurrence of coherence artifacts.

The disclosed embodiments include operating any one or combination of the red laser, the green laser, and/or the blue laser in the RGB laser assembly in a burst or pulsed mode when illuminating a set of one or more pixels for the image. In other words, the RGB lasers initially start out in a non-emitting state. Then, the RGB lasers emit laser light to illuminate a pixel. This illumination occurs for a period of time spanning (according to the disclosed embodiments) less than 15 nanoseconds (ns). By causing the RGB lasers to chirp for this short period of time, the resulting laser light is structured with a reduced spatial coherence level. Once the time period elapses, then the RGB lasers again return to the non-emitting state. By operating the RGB lasers in this manner (i.e. with a reduced spatial coherence), the emitted laser light is structured to have an increased spectral linewidth, which beneficially eliminates the presence of undesired visual artifacts, as will be described in more detail later.

In some instances, technical advantages and improvements over conventional systems are realized by operating the red lasers, green lasers, and/or blue lasers in the RGB laser assembly according to the disclosed embodiments. In particular, conventional systems that utilize lasers to render virtual or holographic content experience many undesired visual artifacts. These artifacts occur (as will be described in more detail later) as a result of the typically high coherence of the laser light. Indeed, in most conventional systems, it is desirable to have high coherence when using a laser because the high coherence results in a more spectrally pure/intense waveform. In contrast to these conventional systems, however, the disclosed embodiments purposely reduce the coherence of laser light (specifically the spatial coherence) to address other problems that can be caused by the highly coherent laser light. Such an operation is counterintuitive, as described above, because most systems try to achieve very high coherence levels for laser light. Nevertheless, such an operation produces unanticipated and highly beneficial results. In particular, implementations of the current embodiments can reduce the occurrence of undesired visual artifacts.

Figure 1:
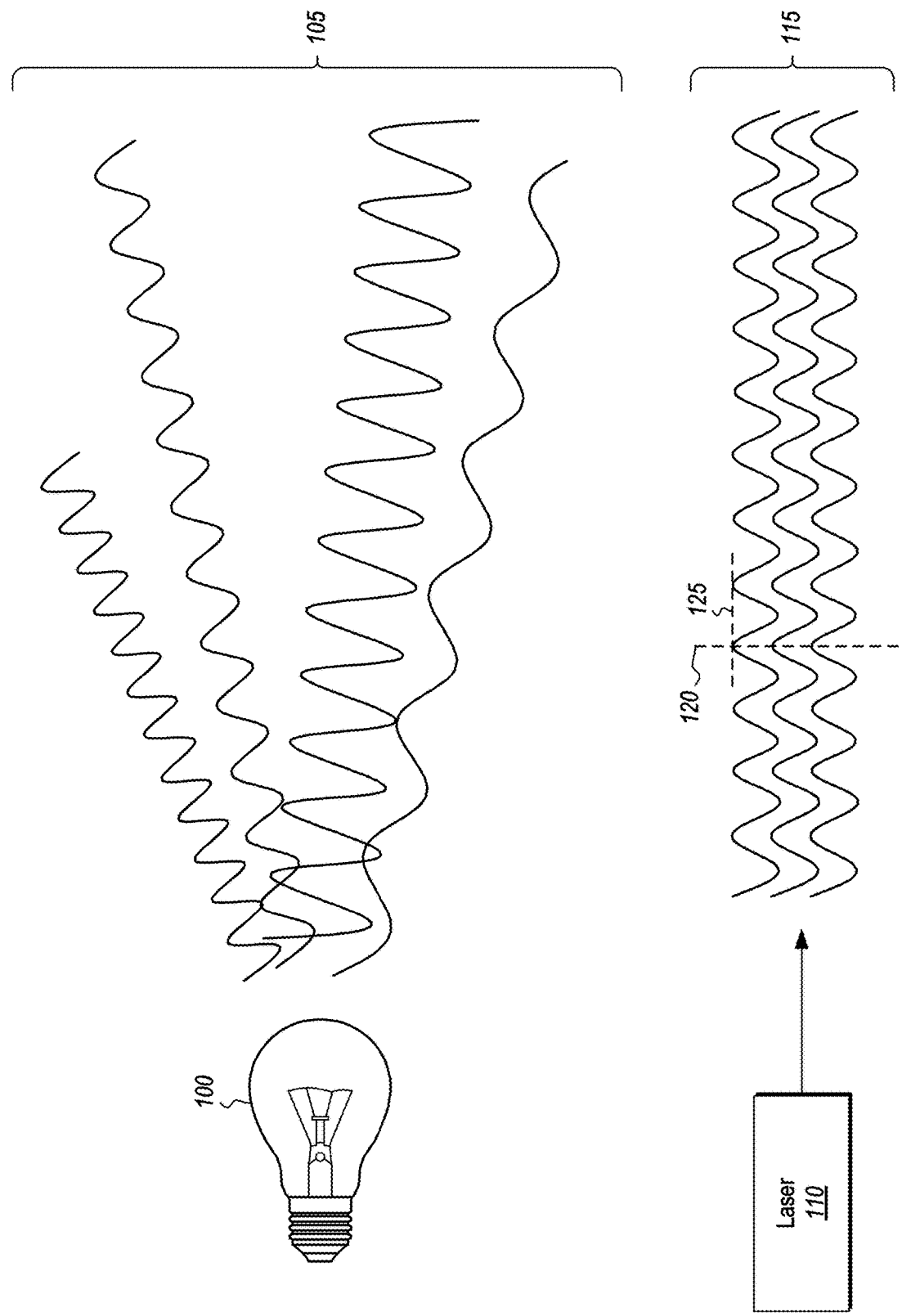
FIG. 1 illustrates the differences in light coherence between light emitted by a light emitting diode (LED) (or lightbulb) and a laser.
Figure 2:
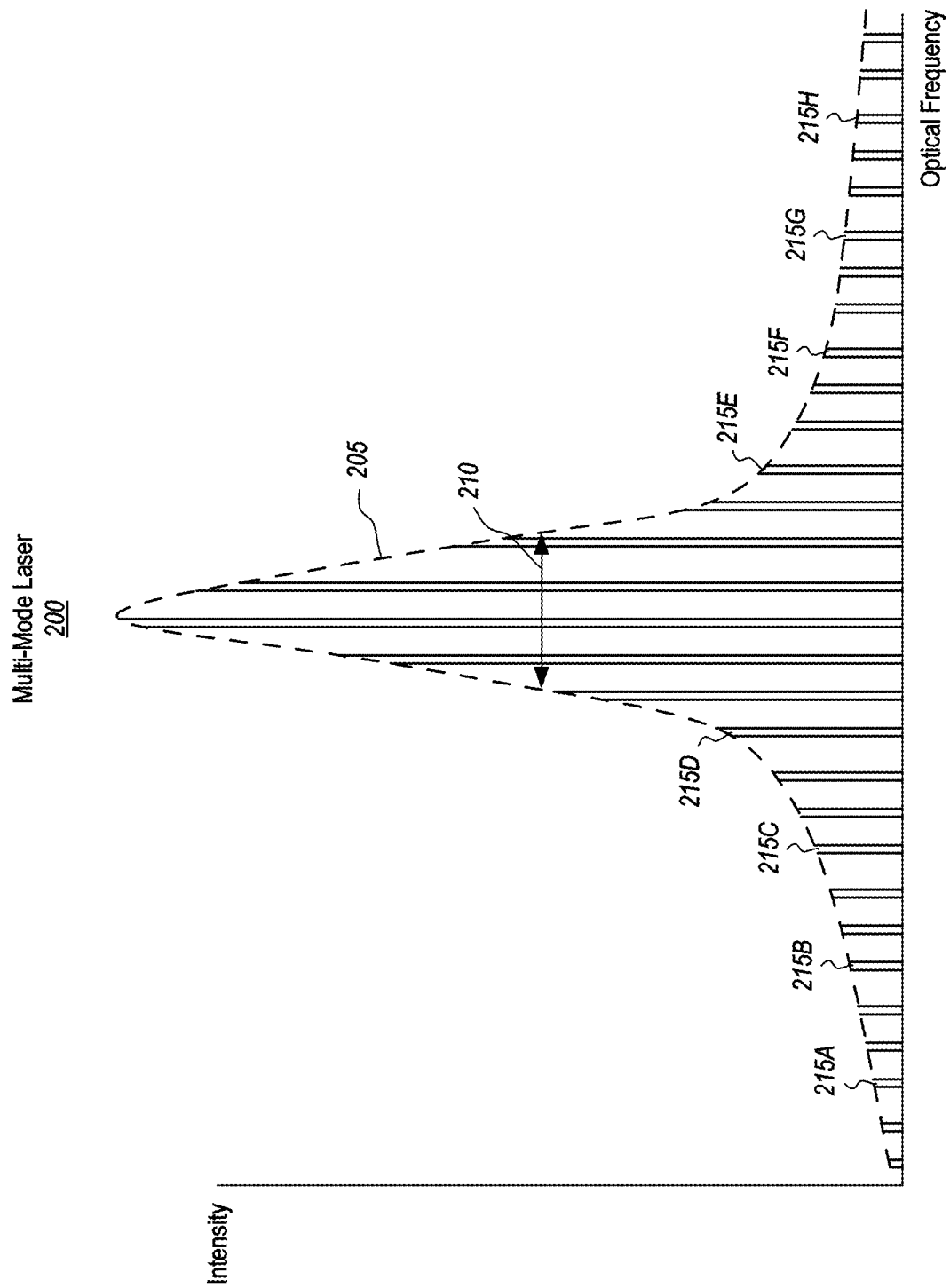
FIG. 2 shows that laser light has different longitudinal modes.

Having just disclosed some of the features and benefits of the embodiments at a high level, the disclosure will now focus on FIGS. 1 and 2 which provide a description of how laser light is structured. Following that discussion, the disclosure will turn to FIGS. 3 through 5 which illustrate how laser light can be used to project images. Next, the disclosure will focus on FIGS. 6 through 15 which illustrate various architectures, supporting illustrations, and operations for controlling the spatial coherence and spectral linewidth of laser light. Finally, the disclosure will turn to FIGS. 16A through 19 which illustrate example methods as well as a computer system capable of performing those methods.

Properties of Light

"Coherence" is a central topic in the field of optics, and the concept of "coherence" generally relates to the capability of light to interfere with itself. To be perfectly "coherent," light from a light source is structured to have a definite phase relationship both in terms of electrical field values at different times and electrical field values at different positions. As such, the term coherency is used to describe the range between incoherent light (i.e. there is little or no degree of phase relationship) and coherent light (i.e. there is a high degree of phase relationship). The topic of coherence is typically broken down into two sub-topics, namely, spatial coherence and temporal coherence.

The term "spatial coherence" is used to describe the correlation between the light's electrical field values at different locations. In other words, spatial coherence relates to how well light waves align with each other at different points along a traversal path. In contrast, the term "temporal coherence" is used to describe the correlation between the light's electrical field values at different points in time. In other words, temporal coherence relates to how well light waves align with each other at a specific location when measured at different points in time.

With that understanding, attention will now be directed to FIG. 1 which illustrates the differences in coherence between light emitted from one light source (e.g., a lightbulb) and light emitted from another light source (e.g., a laser). Specifically, FIG. 1 shows a first type of light source 100. Light source 100 is any type of light source that is not a laser. For instance, light source 100 may be a traditional light emitting diode (LED), a fluorescent lightbulb, the sun, or any other non-laser-type light source. As shown by the light fields 105, light source 100 does not emit coherent light because the light fields 105 are not aligned spatially or temporally.

In contrast, laser 110 is shown as emitting light 115 which does have high coherence characteristics. For example, the vertical dashed line 120 shows that the phase of the light waves correspond with each other and the horizontal dashed line 125 shows that the amplitudes also correspond with one another. Accordingly, emitted light 115 has high spatial coherence and high temporal coherence. In this manner, laser light is structured quite differently than light emitted from other light sources.

The purity of a laser is sometimes referred to as its "linewidth." Generally, the laser's linewidth corresponds to a measurement of the wavelengths that are included in the emitted laser light. As the laser light's linewidth gets narrower (i.e. as the laser light's coherence becomes higher), the emitted light will correspond more closely to only a single wavelength (i.e. a single color). In this regard, a laser is sometimes said to be "monochromatic." In actual practice, however, laser light typically includes a small range of wavelengths and thus is not truly or perfectly monochromatic or coherent. Regardless, as the wavelength range of the laser light gets smaller (i.e. the coherency increases), so too does the linewidth (i.e. it gets more narrow), and it may be suggested that the quality/purity/coherency of the laser improves.

FIG. 2 shows an example of laser light 200, including a symbolic envelope 205 and the linewidth 210. The symbolic envelope 205 is simply a contoured representation of how the laser light 200 generally appears. FIG. 2 also shows the various different Fabry-Perot (FP) modes (or simply "modes") in the form of modes 215A, 215B, 215C, 215D, 215E, 215F, 215G, and 215H. Although only eight modes are labeled, it will be appreciated that the number of modes may be any number (e.g., 1, 2, 3, 4, 5, 6, 7, 8, 9, 10, 20, 50, 100, or more than 100). Furthermore, the depiction shown in FIG. 2 is just a simplified illustration, and it will be appreciated that real laser light may actually have a different appearance.

Some lasers are formed from an assembly that includes at least two parallel mirrors and an active region located between those mirrors. Together, this assembly is often referred to as a "resonator." When multiple wavelengths operate/propagate within the resonator, they can form a standing wave. As such, the attributes of the resonator (e.g., the length of the mirrors, the distance between the mirrors, etc.) influence which wavelengths can successfully propagate in the resonator and thereby form a standing wave. The wavelengths that are supportable by the resonator are often referred to as "longitudinal modes."

Although an innumerable number of wavelengths may exist in the resonator (i.e. the longitudinal modes), the active region of the laser will provide a gain only for a selected wavelength range, which are often referred to the "resonant" wavelengths. Furthermore, laser light is formed only from an even smaller or limited number of those resonant wavelengths. Specifically, only resonant wavelengths whose gains exceed their losses will contribute to the light output of the laser. Resonant wavelengths whose gains exceed their losses (and thus contribute to the laser's output) are referred to as the Fabry-Perot ("FP") modes (e.g., modes 215A, 215B, 215C, 215D, 215E, 215F, 215G, and 215H). These FP modes are shown as being distributed across the "optical frequency" x-axis in FIG. 2. The collective combination of these modes forms the envelope 205. Furthermore, linewidth 210 is typically measured or determined by the full width of the laser light 200 at the laser light 200's half maximum (i.e. "full-width-half-maximum" or simply "FWHM") of the laser light 200's power spectrum, as shown by the "intensity" y-axis in FIG. 2. In this manner, laser light may be created. Furthermore, different colors of laser light (e.g., red, green, blue, etc.) may be formed based on the type or attributes of the laser assembly.

MEMs Systems

Figure 3:
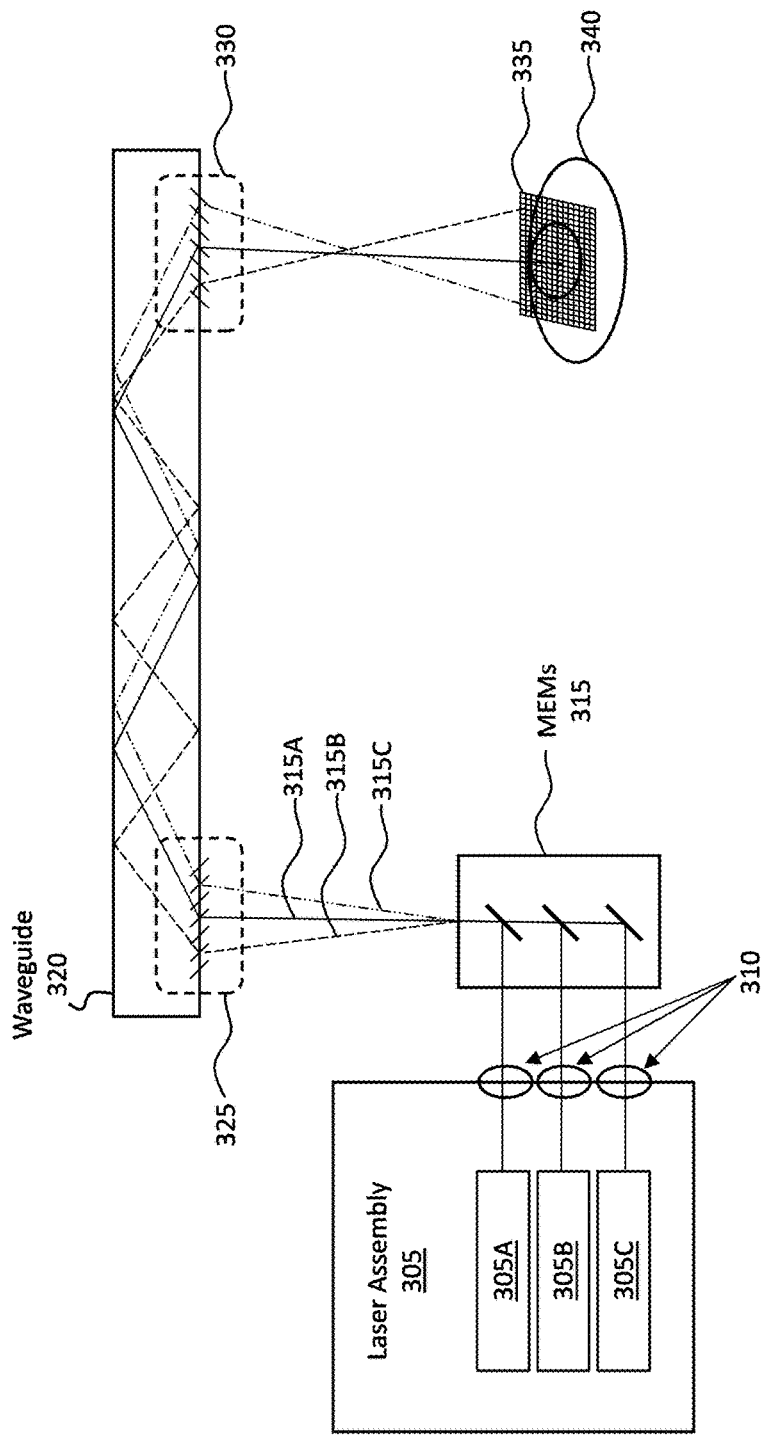
FIG. 3 provides an example architecture in which a microelectromechanical (MEMS) system is used to project light to create AR images and/or VR images (i.e. holograms or holographic images).

Attention will now be directed to FIG. 3 which shows a holographic display 300 that uses a laser assembly 305 with lasers 305A (e.g., a red laser), 305B (e.g., a green laser), and 305C (e.g., a blue laser). The lasers 305A-C may be configured in the manner described with respect to FIGS. 1 and 2. Furthermore, although only three lasers are shown, it will be appreciated that the laser assembly 305 may include any number of lasers. For example, the laser assembly 305 may include 0, 1, 2, 3, or more than 3 red lasers, 0, 1, 2, 3, or more than 3 green lasers, and 0, 1, 2, 3, or more than 3 blue lasers. Any combination or modification in the number of lasers may also be available (e.g., 2 red, 2 green, 2 blue, or 1 red, 1 green, 2 blue, etc.). Accordingly, any number of lasers may be used to irradiate/illuminate pixels for generating virtual or holographic image content.

In some instances (though not all), the laser assembly 305 also includes one (or more) collimating lens 310 (or other diffractive optical element) that is structured to direct light to another location or otherwise operate on the light in some manner. In this example, each of the lasers 305A, 305B, and 305C has a corresponding collimating lens. In some embodiments, however, a single collimating lens may be used for more than one laser. In this example scenario, the holographic display 300 also includes a microelectromechanical mirror (MEMs) system 315, though the principles disclosed herein are applicable to any type of laser-based display unit and not only to architectures with the MEMs system 315. In the example shown in FIG. 3, the MEMs system 315 is collecting laser light from three different sources (i.e. the lasers 305A, 305B, and 305C). Additionally, the MEMs 315 is combing these three different laser lights into a single laser beam, such as is shown by laser light 315A. The MEMs system 315 then directs the combined laser light 315A (which, in this example is a combination of red laser light, green laser light, and blue laser light) to a waveguide 320. Furthermore, the MEMs system 315 is able to redirect its mirrors/mirror array so that the laser light 315A is aimed at different locations at the waveguide 320. For instance, the laser light 315B and 315C are also combined laser beams (i.e. a combined beam comprising red laser light, green laser light, and blue laser light). As shown, laser lights 315B and 315C are aimed at different locations on the waveguide 320. In this manner, the MEMs system 315 is able to route light to different locations by adjusting the aim of its corresponding mirror array.

As shown, laser light 315A, 315B, and 315C, which is produced by the lasers 305A, 305B, and 305C, respectively, (e.g., by combing the red laser light from laser 305A, the green laser light from laser 305B, and the blue laser light from laser 305C) is re-projected or re-routed by the MEMs system 315 to the waveguide 320. In these example scenarios, the laser 305A is a red laser, laser 305B is a green laser, and laser 305C is a blue laser. Consequently, the laser light 315A-C is a combined laser beam comprising a combination of red laser light, green laser light, and blue laser light. Of course, it will be appreciated that the laser lights 315A-C may consist of varying degrees or intensities (or even an absence of any one or more) of red, green, and blue laser light.

The MEMs system 315 then redirects the laser light 315A-C (which is a combined laser beam comprising any combination of red laser light, green laser light, and blue laser light) to a waveguide 320. This waveguide 320 is useful for redirecting or propagating the laser light 315A-C to a desired location which is viewable by a user's eye. It will be appreciated that waveguide 320 may be any type of waveguide display (e.g., a surface relief grating waveguide).

By directing the laser light 315A-C in this manner, the MEMs system 315 is able to generate an entire holographic image by scanning (e.g., by adjusting the mirror array so that the combined RGB laser beam or light is aimed at different locations) individual pixels of that image in such a rapid manner that the entirety of the hologram/holographic image appears before the user's eye without the user realizing that the image was progressively scanned pixel by pixel and line by line. In this regard, the MEMs system 315 is able to scan an image (i.e. pixels of that image) at any image resolution or range of image resolutions (e.g., in cases where foveated rendering is used). For example, in some embodiments, the MEMs system 315 is configured to scan RGB light from the laser assembly 305 with a resolution of 2,000 pixels by 1,200 pixels, or any other resolution.

FIG. 3 also shows laser light 315A-C entering the waveguide 320 via an entry grating 325. Once laser light 315A-C enters waveguide 320, then it propagates (e.g., reflects back and forth off of the walls of waveguide 320) through waveguide 320 until it reaches an exit grating 330. By configurating the entry grating 325 and the exit grating 330 to meet certain design parameters, MEMs system 315 is able to use waveguide 320 to progressively scan a set of pixels 335 to a target display area for a user's eye 340 to view. In this manner, the MEMs system 315, in conjunction with the laser assembly 305 and the waveguide 320, is able to project or render holographic image content for a user to view and interact with. It will be appreciated that the angles with which the laser light enters the waveguide 320 are preserved as the laser light 315A-315C propagates through the waveguide 320. This condition is shown by the different angles that each of the respective laser lights 315A-C is propagating through the waveguide 320.

Figure 4:
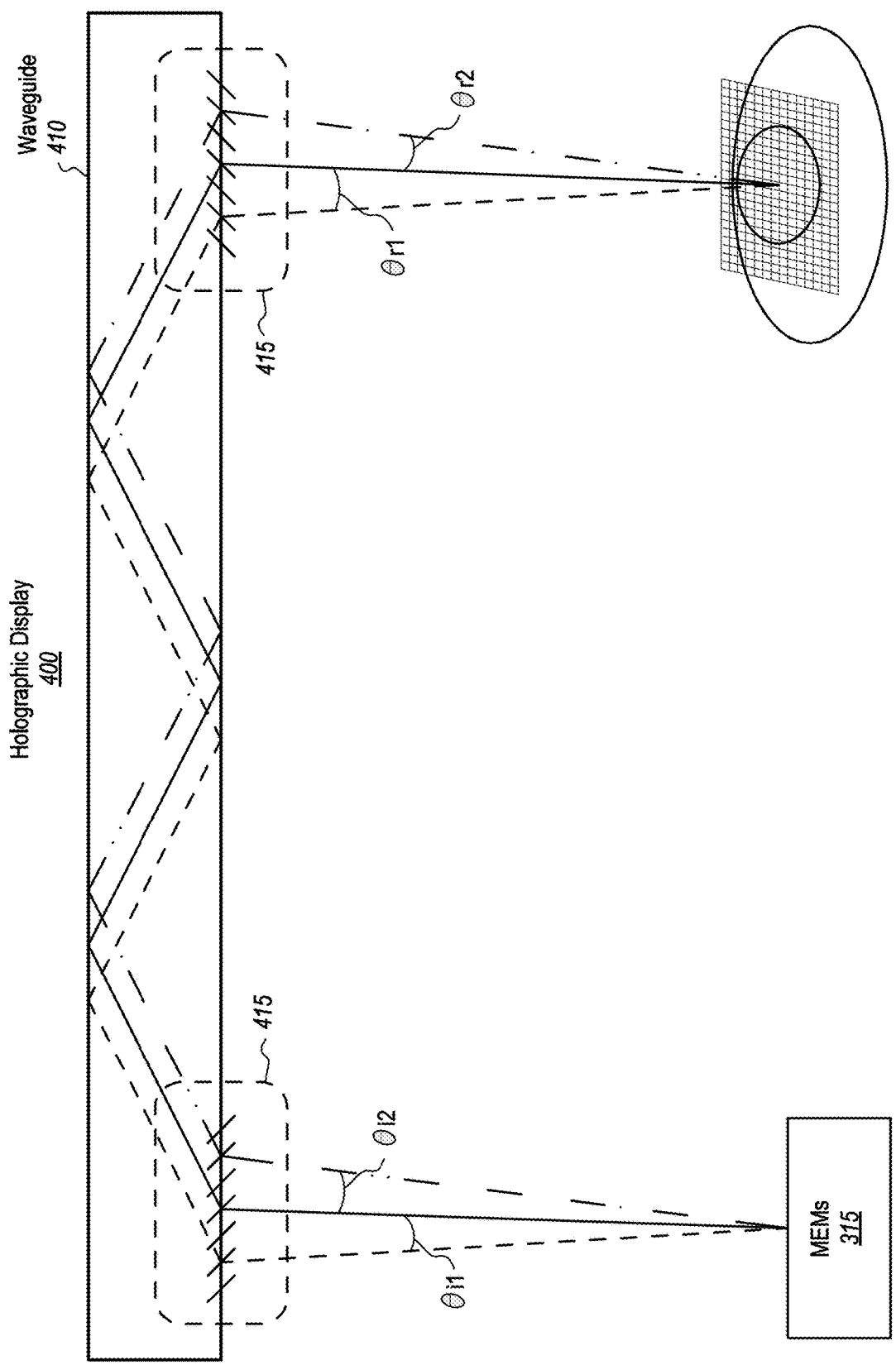
FIG. 4 provides a view of a waveguide that can be used to project holographic images.

FIG. 4 shows a blown-up view of a portion of a holographic display 400, which is representative of the holographic display 300 of FIG. 3. In particular, FIG. 4 more fully emphasizes the angular relationships of the reflecting/propagating laser light.

As shown, MEMs system 405 directs laser light (e.g., RGB laser light) to a waveguide 410 which includes an input or entry grating 415. MEMs system 405 is able to direct the laser light so that it enters the entry grating 415 at any desired angle, such as angles $\theta_{i1}$ and $\theta_{i2}$. As MEMs system 405 performs its scanning operations, these angles will change based on how MEMs system 405 aims the laser light at entry grating 415. Once inside waveguide 410, the laser light propagates through waveguide 410 until it reaches the exit grating 420.

Worthwhile to note, the angles at which the laser light leaves the exit grating 420 are the same as the angles at which the laser light entered the entry grating 415. In other words, angles $\theta_{r1}$ and $\theta_{r2}$ are the same as angles $\theta_{i1}$ and $\theta_{i2}$, respectively. In this regard, MEMs system 405 is able to progressively scan individual pixels of a hologram.

Figure 5:
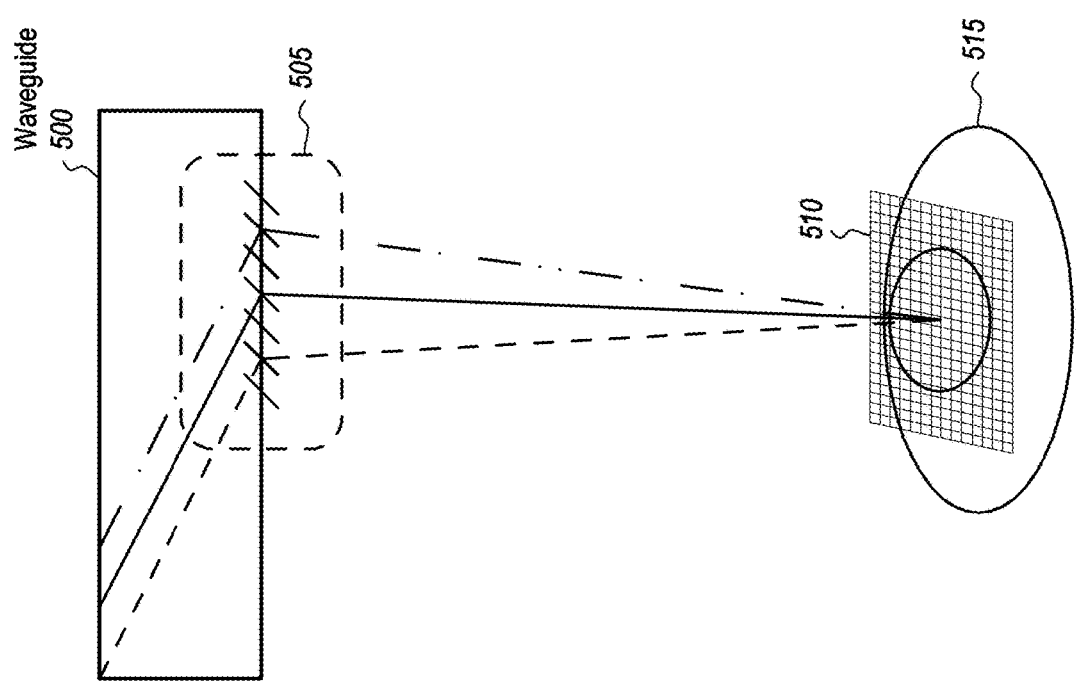
FIG. 5 provides another view of a waveguide that includes an exit grating.

FIG. 5 more fully illustrates this scanning operation. In particular, there is provided a waveguide 500, which is representative of the waveguides 410 and 320 from FIGS. 4 and 3, respectively. The laser light exits waveguide 500 via the exit grating 505 (and in the same angular relationship the laser light had when it entered the waveguide 500). By aiming the laser light (which may include any combination of red laser light, green laser light, and/or blue laser light), the MEMs system is able to progressively scan an area 510 which represents or corresponds to a holographic/virtual image. Because area 510 is viewable by a user's eye 515, the user is able to view and interact with the holographic image. In this regard, holographic images may be projected to a user's eye via the waveguide 500.

Optical Coherence In A Waveguide Resulting In Artifacts

Figure 6:
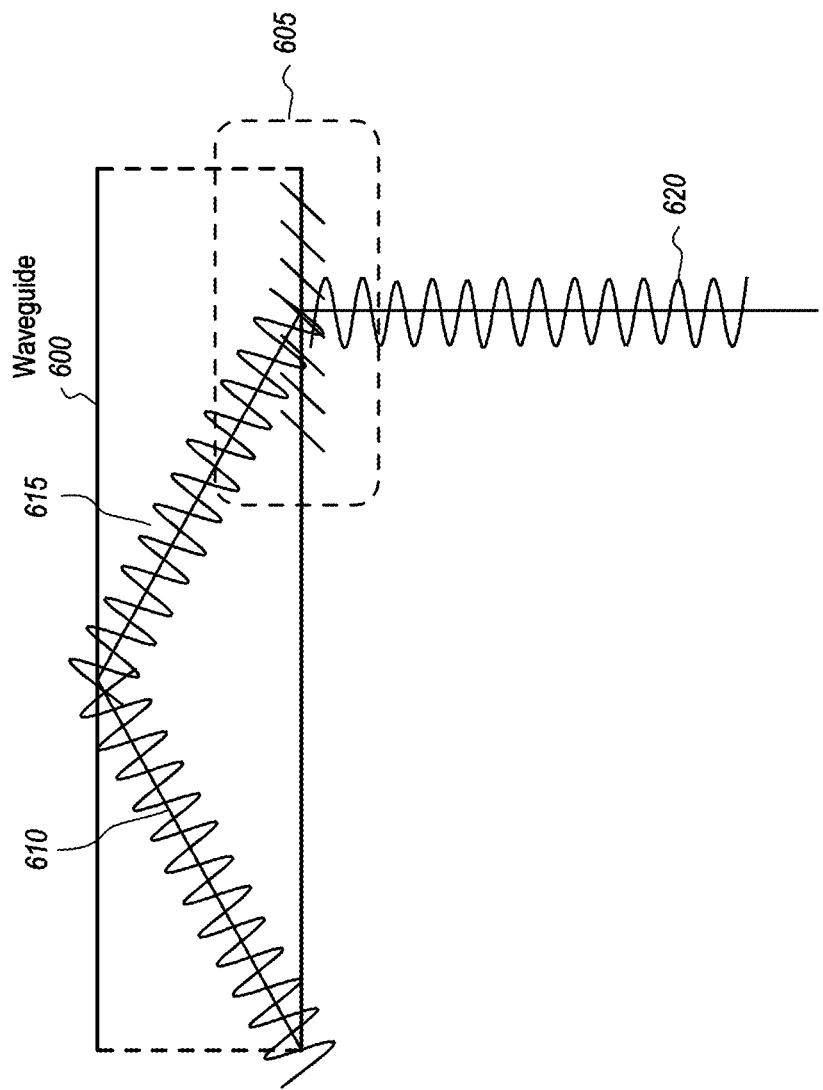
FIG. 6 illustrates properties of laser light, having wave-like characteristics that can persist when passing through a waveguide.

Having just described the properties of a laser and of a holographic display, attention will now be directed to FIG. 6 which shows some further characteristics and properties of how laser light propagates through a waveguide. Here, waveguide 600 is shown and is representative of the waveguides discussed earlier. Waveguide 600 also includes an exit grating 605, similar to the earlier exit gratings.

As discussed earlier, laser light has some wavelike characteristics. These wavelike characteristics are shown by waves 610, 615, and 620. As laser light propagates or reflects back and forth through waveguide 600 (e.g., wave 610 reflects off of a wall to form wave 615), the laser light will eventually reach and pass through exit grating 605, as shown by wave 620.

Figure 7:
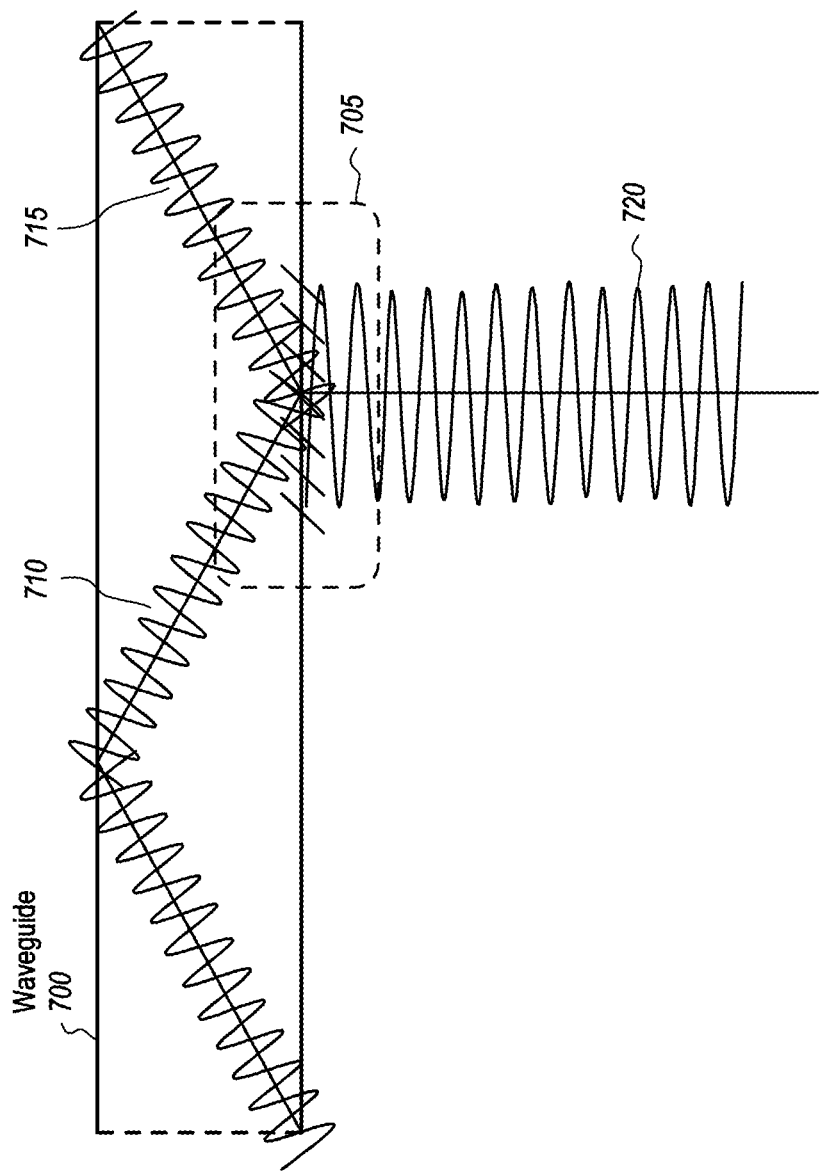
FIG. 7 illustrates an embodiment of light being scattered within a waveguide in such a manner that back reflections are created and which, in some instances, interfere with light exiting through exit grating of a waveguide and in such a manner that can create areas of brightness and areas of darkness.

In some instances, due to the nature of laser light (e.g., the waveform or wavelength properties) as well as the attributes of the waveguide (e.g., its length, reflective properties, and other attributes), certain transformations may occur to the laser light. For example, FIG. 7 shows a waveguide 700 with an exit grating 705. As laser light 710 propagates through waveguide 700, some portions of that laser light 710 will exit waveguide 700 via exit grating 705. Other portions of laser light 710, however, will persist in waveguide 700 beyond the exit grating 705, as shown by laser light 715.

In some circumstances, laser light 715 will be reflected and may eventually return to exit grating 705. At that time, some of laser light 715 and some of laser light 710 may interfere with each other. In some scenarios, this interference results in a constructive combination of laser light 710 and laser light 715, resulting in the constructive laser light 720. As shown, constructive laser light 720 is the added combination or collection of laser light 710 and laser light 715. Such constructive combination periodically occurs and is a result of (1) the angles at which the laser light enters waveguide 700, (2) the attributes of the waveguide 700, (3) the attributes of the laser light (e.g., waveform/wavelength), and other factors.

When such a constructive or destructive interference condition occurs, it produces an optical phenomenon or visual imaging artifact. As used herein, an artifact is an undesired interference fringe that appears in the user's field of view. These interference fringes are caused, as described above, by a match in the optical path length of the waveguide (to the target display area, such as the user's eye) and to the physical distance where the laser is spatially coherent. This coherence distance is referred to as the "coherence function of the laser" and is related to the Fourier Transform of the laser's spectral characteristics.

Figure 8:
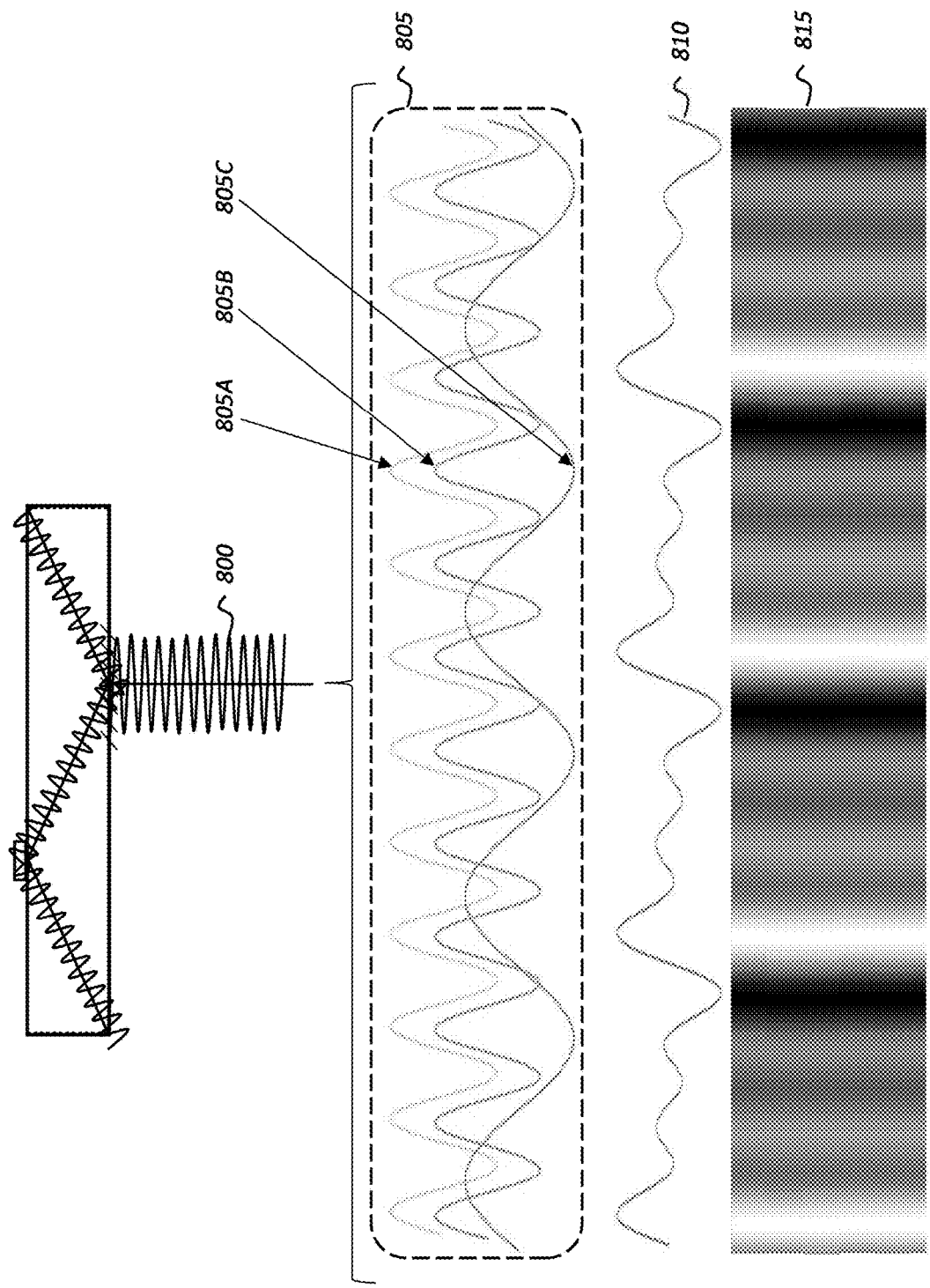
FIG. 8 illustrates a view of interference and resulting bright and dark patches, (i.e. constructive and destructive interference effects).
Figure 9:
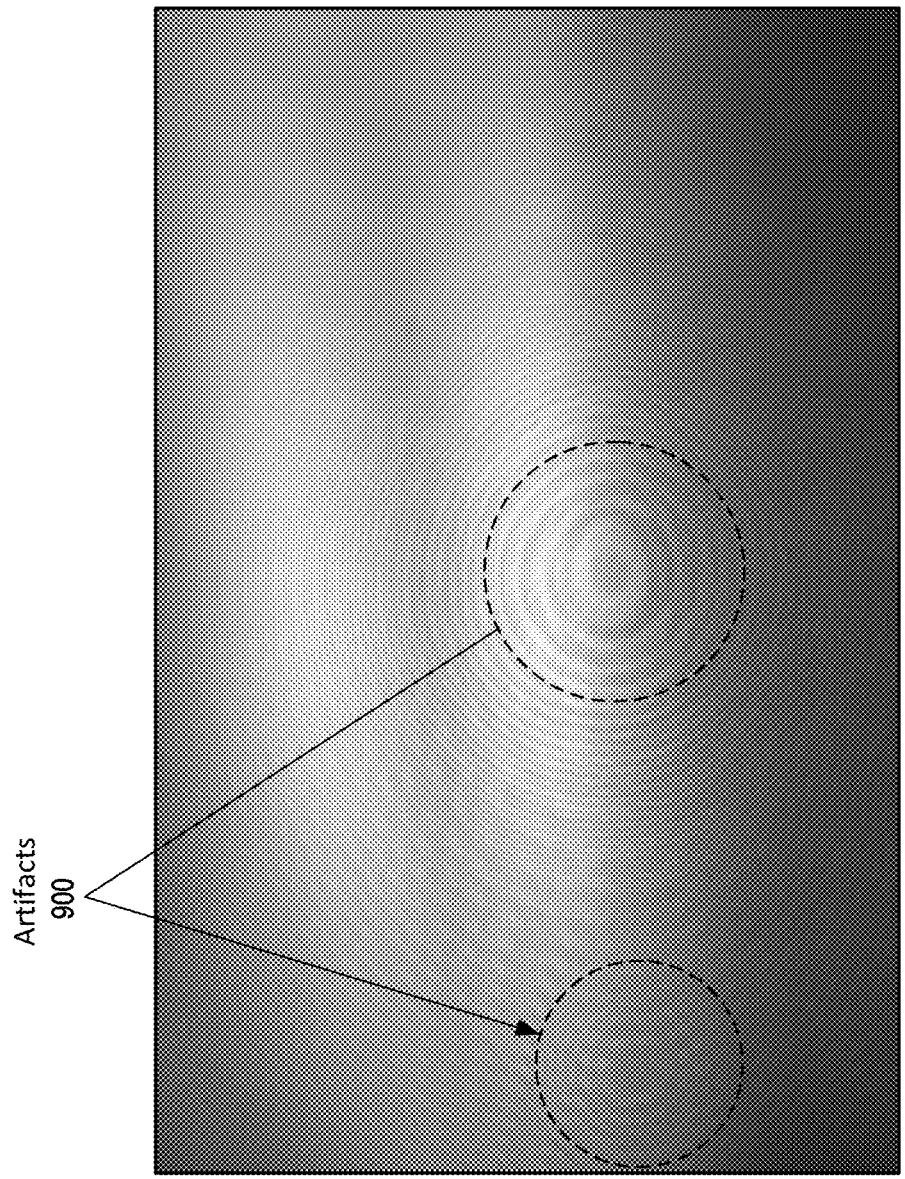
FIG. 9 illustrates a practical result of the bright and dark areas.

FIGS. 8 and 9 provide a description relating to artifacts. Turning first to FIG. 8, there is provided a similar architecture as that which was shown in FIG. 7. In particular, there is illustrated laser light 800, which is representative of constructive laser light 720 from FIG. 7. As shown, there are various instances in which, due to the wavelike properties of laser light, certain interferences occur. For instance, laser light 800, which is propagating out of the waveguide, is actually generated from the construction of multiple waveforms 805 (e.g., waveform 805A, waveform 805B, and waveform 805C). In this manner, multiple waveforms 805 and laser light 800 are actually the same waveform, but the multiple waveforms 805 are provided to illustrate how the end result (i.e. laser light 800) is actually a combination of multiple separate waveforms. Furthermore, waveform 810 is a composite of the multiple waveforms 805. In other words, laser light 800 is the same as the combination of the multiple waveforms 805, which combination is illustrated as waveform 810 (thus, laser light 800 is actually in the form of waveform 810). These multiple illustrations were provided to better describe the properties of the laser light exiting the waveguide. As shown, waveform 810 is not a sinusoidal wave. Instead, it has multiple peaks as valleys as a result of the interference from the combination of each of the multiple waveforms 805. These interferences are a result of back scattering and/or back reflections combining with the outgoing laser light exiting the waveguide. As a result of these interferences, various different bright and dark rings/spots are created, as shown by the illumination 815, where the peaks correspond to lighter areas and the valleys correspond to darker areas.

FIG. 9 shows an actual depiction of an artifact 900. To clarify, FIG. 9 shows an actual rendition of the appearance of artifact 900, which can affect the image being rendered by the laser light that is causing the artifact 900. Although the rendered image is not presently shown, the artifact 900 includes circular irregularities in terms of brightness that will correspondingly modify the image being rendered and which can negatively affect the user experience.

Operating RGB Lasers to Remove Undesired Artifacts

As described, conventional laser imaging techniques used for rendering holographic content in a mixed-reality environments can experience negative effects, such as artifacts, because of the high purity and/or high coherency of the lasers that are used. Consequently, there is a need to improve how holographic content is rendered from the lasers to help mitigate these negative effects.

The disclosed embodiments can be used to help solve these problems by dynamically controlling the spectral properties of a laser when it is used to render holographic content. In particular, the disclosed systems and methods operate to reduce the spatial coherence of a laser by operating in a chirped, or rather fast-pulsed mode, where every pixel is illuminated by a separate red, green, and/or blue laser pulse for only a very brief period of time. By operating the lasers in a fast-pulsed mode, the spatial coherence of the resulting laser light emission is reduced and the spectral linewidth of that emission is increased. As a direct result of these operations, the disclosed embodiments are able to reduce and/or entirely eliminate interference fringes (e.g., artifacts) from the display, thereby improving the display quality as well as the user's experience, as will be described in further detail later.

Specifically, by modulating a laser with short (e.g., less than 15 nanoseconds (ns)) optical pulses, it is possible to increase the spectral envelope (i.e. the linewidth) of the laser light, thereby reducing spatial coherence. In this regard, the laser light's spectral linewidth can be increased by operating the device with extremely short electrical pulses.

Increasing a laser's spectral envelope or linewidth is considered undesirable for conventional systems. However, when done properly, this modification can actually result in an unanticipated benefit of reducing the creation of undesired laser artifacts. For example, most fiber-based communications desire to use as high of a coherence as possible. In contrast, the disclosed embodiments actually operate to reduce coherence to bring about highly beneficial results (i.e. the elimination of the visual artifacts). As a result, the disclosed embodiments actually bring about unanticipated and counter-intuitive (but highly beneficial) results.

Figure 10:
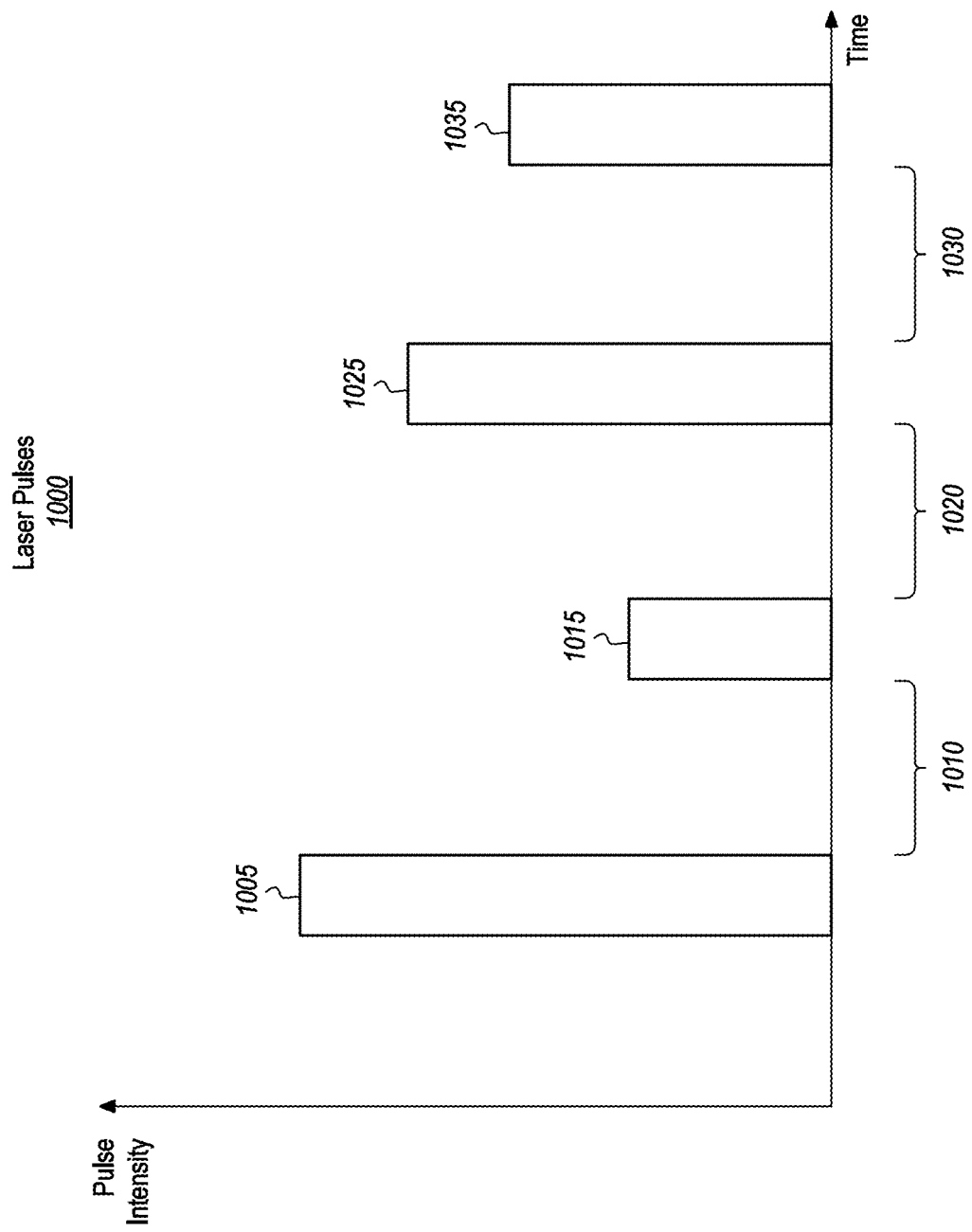
FIG. 10 illustrates a representation of pulsed RGB light.

FIG. 10 shows an illustration of how laser light can be pulsed. In this illustration, a laser pulses graph 1000 includes a plurality of laser pulses that are graphed by "time" (x-axis) and "pulse intensity" (y-axis). In particular, the laser pulses graph 1000 includes a number of different pulses (e.g., pulses 1005, 1015, 1025, and 1035) separated by a plurality of corresponding non-emission periods (e.g., non-emissions 1010, 1020, and 1030). As described above, the pulses 1005, 1015, 1025, and 1035 are configured to last less than 15 ns. In some embodiments, the pulses are reduced in duration even further such that they last anywhere between (and including) 1 ns to 8 ns. In this manner, a pre-selected period of time (e.g., 8 ns) may be used to selectively pulse a laser or a combination of multiple lasers. For example, an RGB laser assembly may include a red laser, a green laser, and a blue laser. Each of these lasers may be used to illuminate a particular pixel when rendering holographic content. By selectively pulsing any one or combination of the red, green, and blue lasers for the pre-selected period of time, then the embodiments are able to improve image quality by removing undesired artifacts.

In this regard, it can be said that the embodiments cause an RGB laser assembly to emit laser light periodically based on a pre-selected schedule or frequency. As such, during periods when the RGB laser assembly is energized with electrical current, these periods constitute "lasing" periods. Furthermore, and as suggested by the term "pulse," the process of selectively pulsing the RGB laser assembly includes causing the RGB laser assembly to refrain from generating a stimulated emission (i.e. RGB laser light) in between the lasing periods (as shown by the non-emissions 1010, 1020, and 1030). This may include turning the laser off (e.g., by cutting off all power to the laser) and/or by reducing the power provided to the laser to the point that light is not emitted from the laser and without turning the laser completely off.

Figure 11:
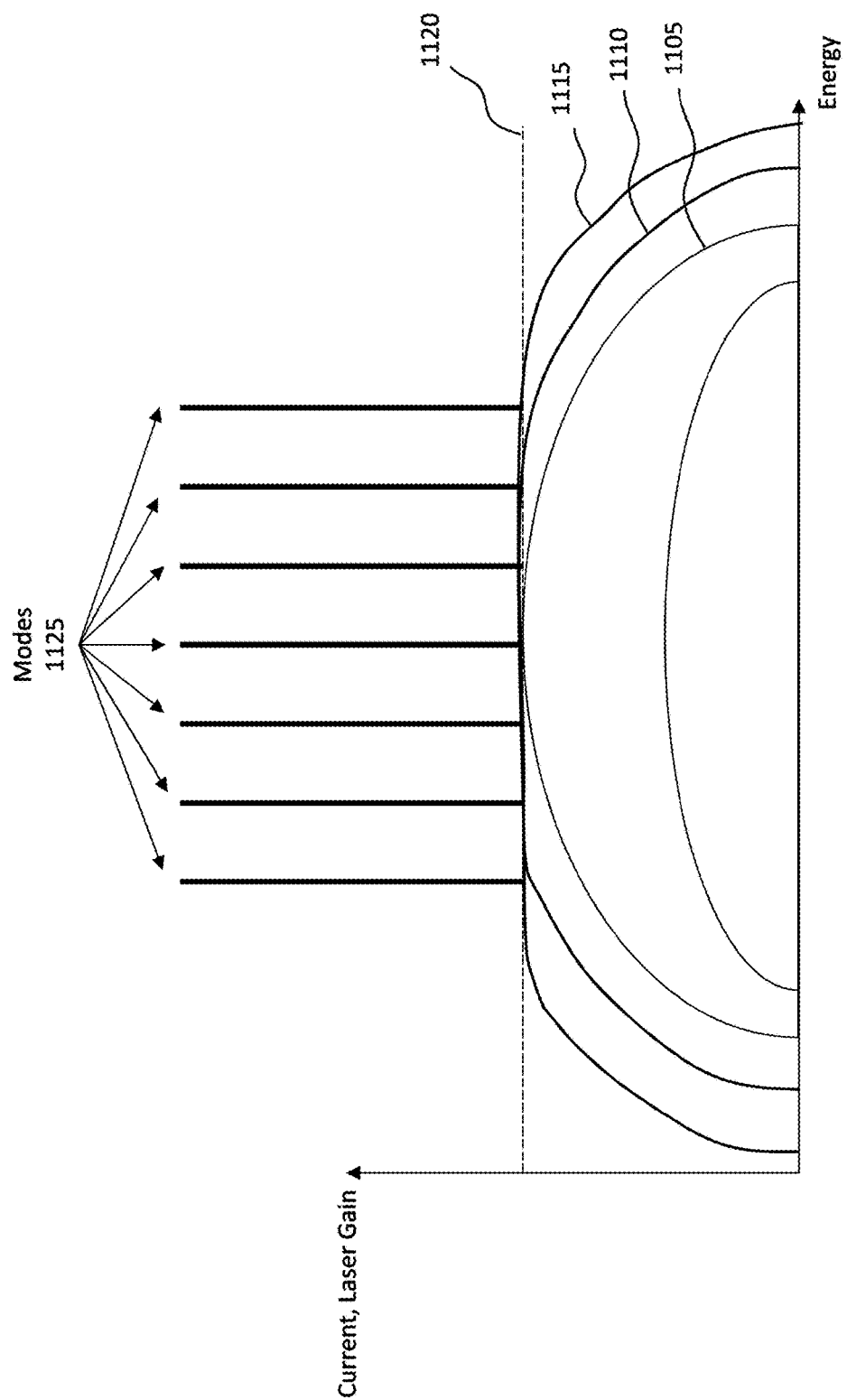
FIG. 11 illustrates a representation of laser light being emitted within different modes and at different energy levels.

FIG. 11 provides an illustration showing how the embodiments are able to broaden the laser's spectral linewidth. Specifically, FIG. 11 shows a graph, where the x-axis represents energy and the y-axis represents the amount of current or laser gain for a laser.

As the laser device is pumped with small amounts of current (e.g., pumps 1105, 1110, and 1115), a lasing "gain"

is produced, as was described earlier in connection with FIG. 2. As also described in connection with FIG. 2, there is some threshold level 1120 that is required to enable the laser to lase. Normally, the laser's gain is clamped at the threshold level 1120, as shown in FIG. 11, such that the pumps 1110 and 1115 are restricted near the threshold level 1120.

When the laser is pulsed, it is advantageous to pulse the laser in a manner so that the resulting gain is above the threshold level 1120. By operating above this threshold level 1120, the number of supported FP modes (e.g., modes 1125) increases, and thus the spectral linewidth of the laser also increases.

Additionally, for very short pulses, (e.g., <15 ns), the optical gain can temporarily exceed the threshold level 1120, further increasing the spectral linewidth of the emitted pulses. This phenomenon is known as "relaxation oscillations."

In some embodiments, selectively pulsing any one or combination of the RGB lasers is performed by initially biasing those lasers to operate below a threshold current or laser threshold (e.g., the threshold level 1120) between each of the laser pulses. For example, after the RGB laser assembly is energized with electrical current for the pre-selected period of time, the embodiments will refrain from biasing the RGB lasers above each of their respective RGB laser thresholds so that those lasers do not emit laser light. Subsequently, the RGB lasers may again be energized above their respective threshold levels so that they do emit laser light. In this manner, the RGB lasers will generate pulsed laser light emissions, in the manner described earlier.

Figure 12A:
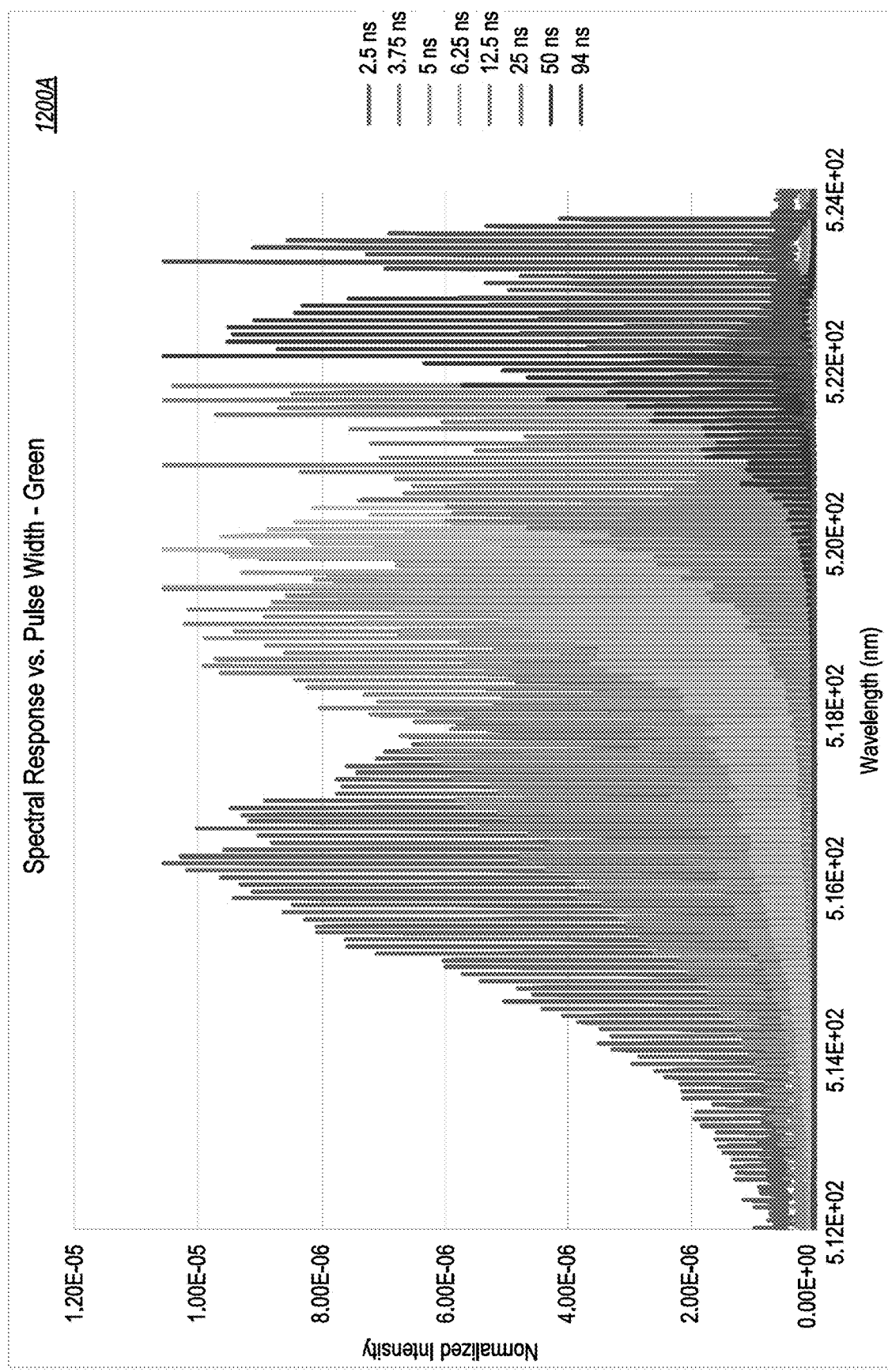
FIGS. 12A, 12B, and 12C illustrates a graph of the spatial coherence and spectral linewidth of laser light.
Figure 12B:
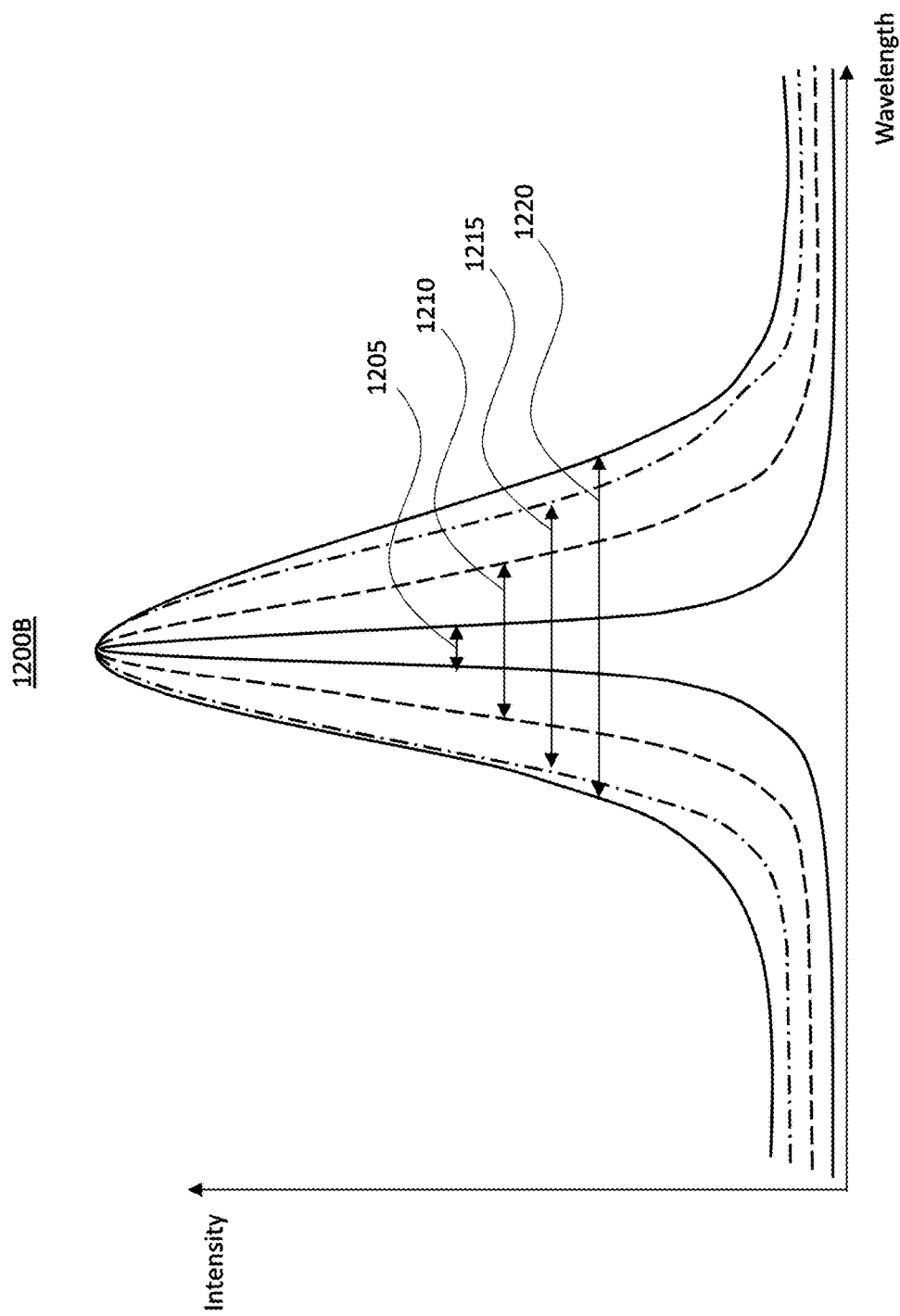
Figure 12C:
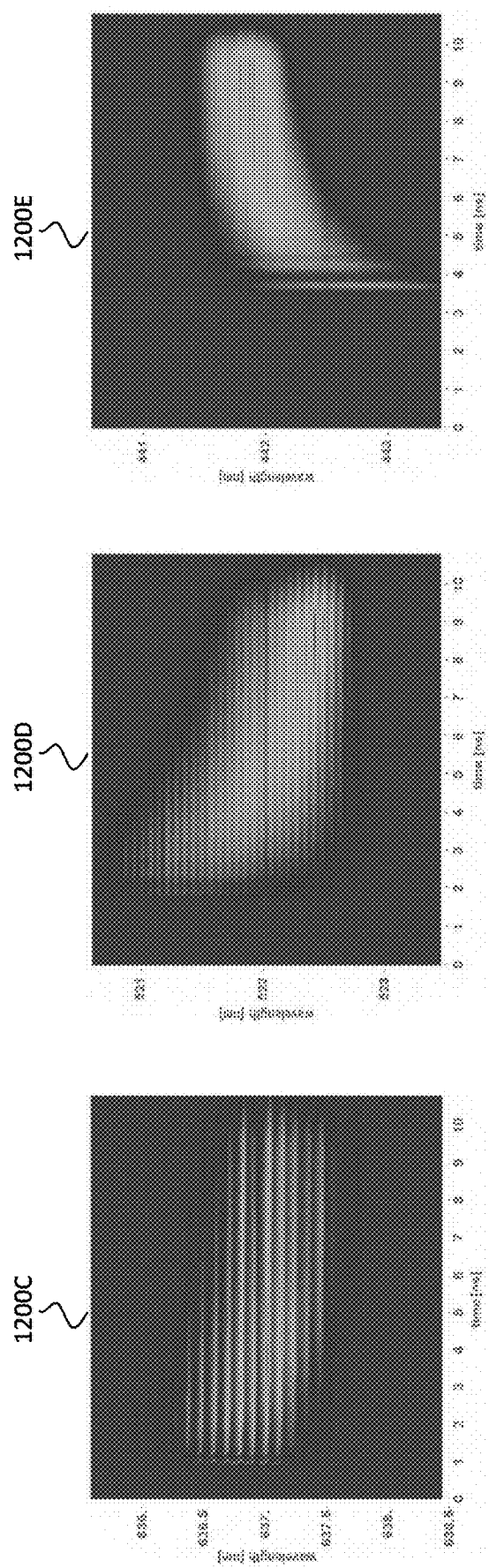

This spectral linewidth response is shown in FIGS. 12A, 12B, and 12C. FIG. 12A shows a graph 1200A with a number of different plots representing the spectral linewidth of a laser when that laser is pulsed for different durations. Specifically, graph 1200A shows a plot when the pulsed emissions last a duration of 94 ns, 50 ns, 25 ns, 12.5 ns, 6.25 ns, 5 ns, 3.75 ns, and 2.5 ns. When the pulse duration is longer (e.g., 94 ns), the spectral linewidth is more narrow than when the pulse duration is smaller (e.g., 2.5 ns). Therefore, by chirping or pulsing the laser, the spectral linewidth of the emitted laser light is broadened and the coherence decreased. The process of pulsing the laser can be specially engineered, calibrated, or otherwise determined so that the spectral linewidth of the emitted laser light satisfies a pre-selected width and/or wavelength threshold.

For instance, in some embodiments, the pre-selected width threshold ranges between 1.0 nm in wavelength up to 5.0 nm in wavelength (e.g., 1.0, 1.25, 1.5, 1.75, etc.) such that the spectral linewidth is anywhere between 1.0 nm and 5.0 nm (e.g., 1.0, 1.25, 1.5, 1.75, etc.) as measured by the full-width-half-maximum intensity.

FIG. 12B shows another comparison of different spectral linewidths that occur as a result of decreasing the duration of a laser pulse. Specifically, FIG. 12B shows a graph 1200B with four different laser emissions. As shown, each of these emissions has a different spectral linewidth (e.g., spectral linewidths 1205, 1210, 1215, and 1220). While conventional systems typically operate using a very tight or narrow spectral linewidth (e.g., spectral linewidth 1205), the disclosed embodiments operate using broader spectral linewidths (e.g., spectral linewidth 1220).

FIG. 12C provides another descriptive representation of broader spectral linewidths. As shown, there are three different plots, namely, plots 1200C, 1200D, and 1200E. Each of these plots shows an increased spectral linewidth due to the short pulse operation and a corresponding reduction in the coherence of the laser light.

Figure 13:
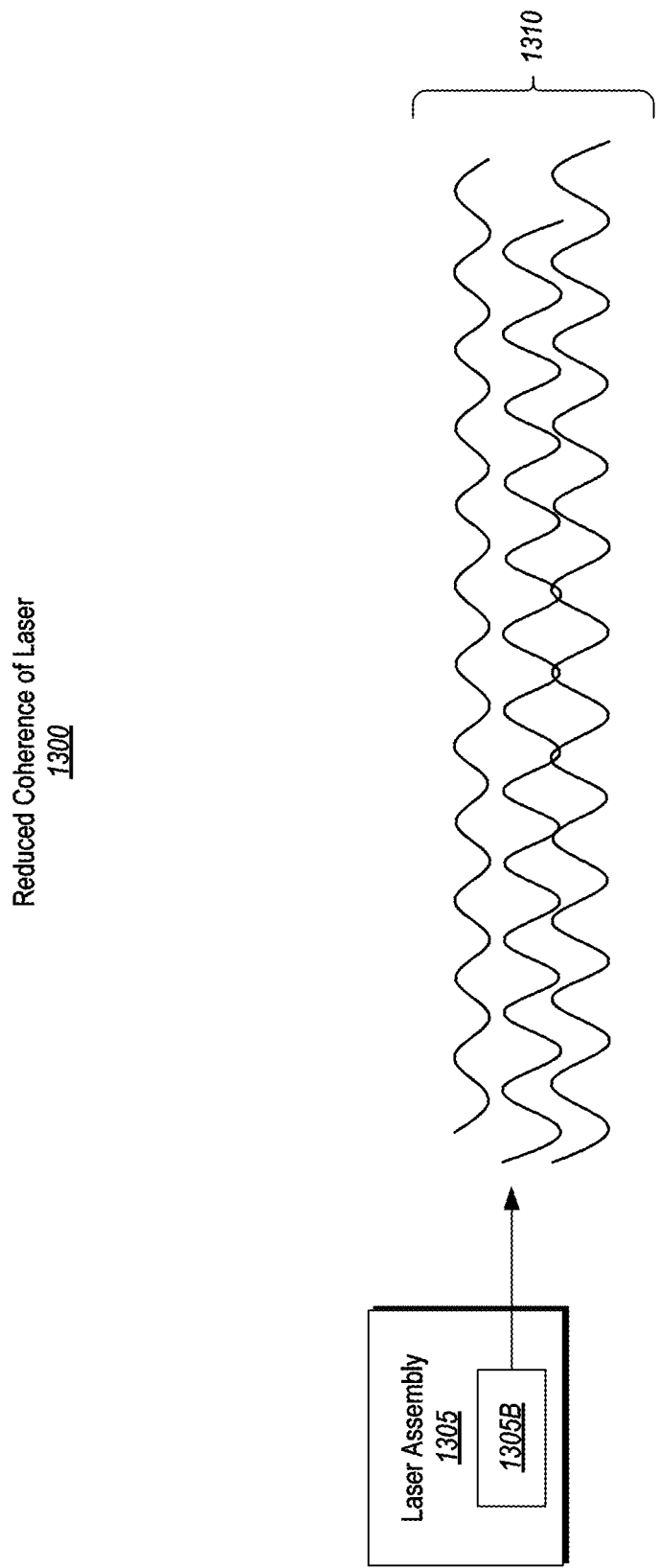
FIG. 13 provides another illustration of laser light spatial coherence.

FIG. 13 is similar to FIG. 1, but now shows a reduction in the coherence of a laser 1300. Here, there is a laser assembly 1305 with at least one laser 1305B. The laser 1305B is emitting laser light 1310. In this example scenario, the spatial coherence of the laser light 1310 has been reduced, in contrast with the high spatial coherence of the emitted light 115 in FIG. 1.

Figure 14:
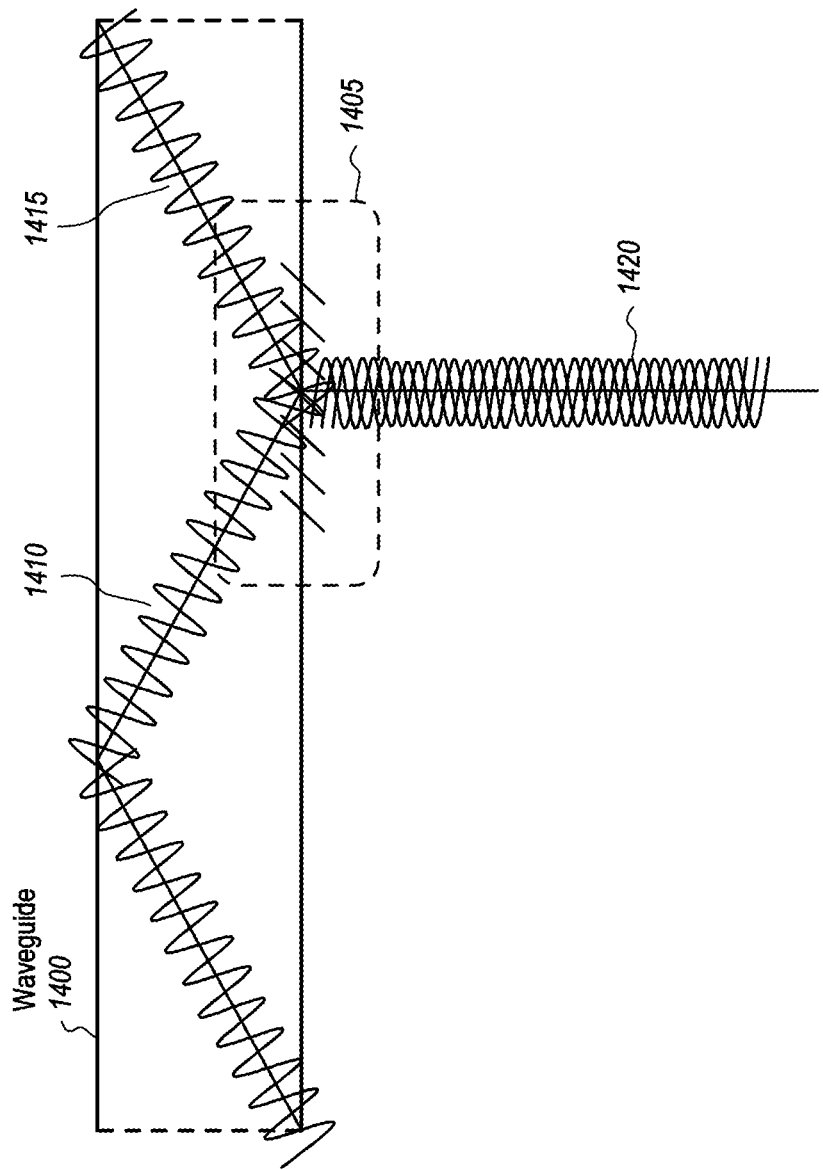
FIG. 14 illustrates practical results of modifying spatial coherence (and spectral linewidth) of laser light.
Figure 15:
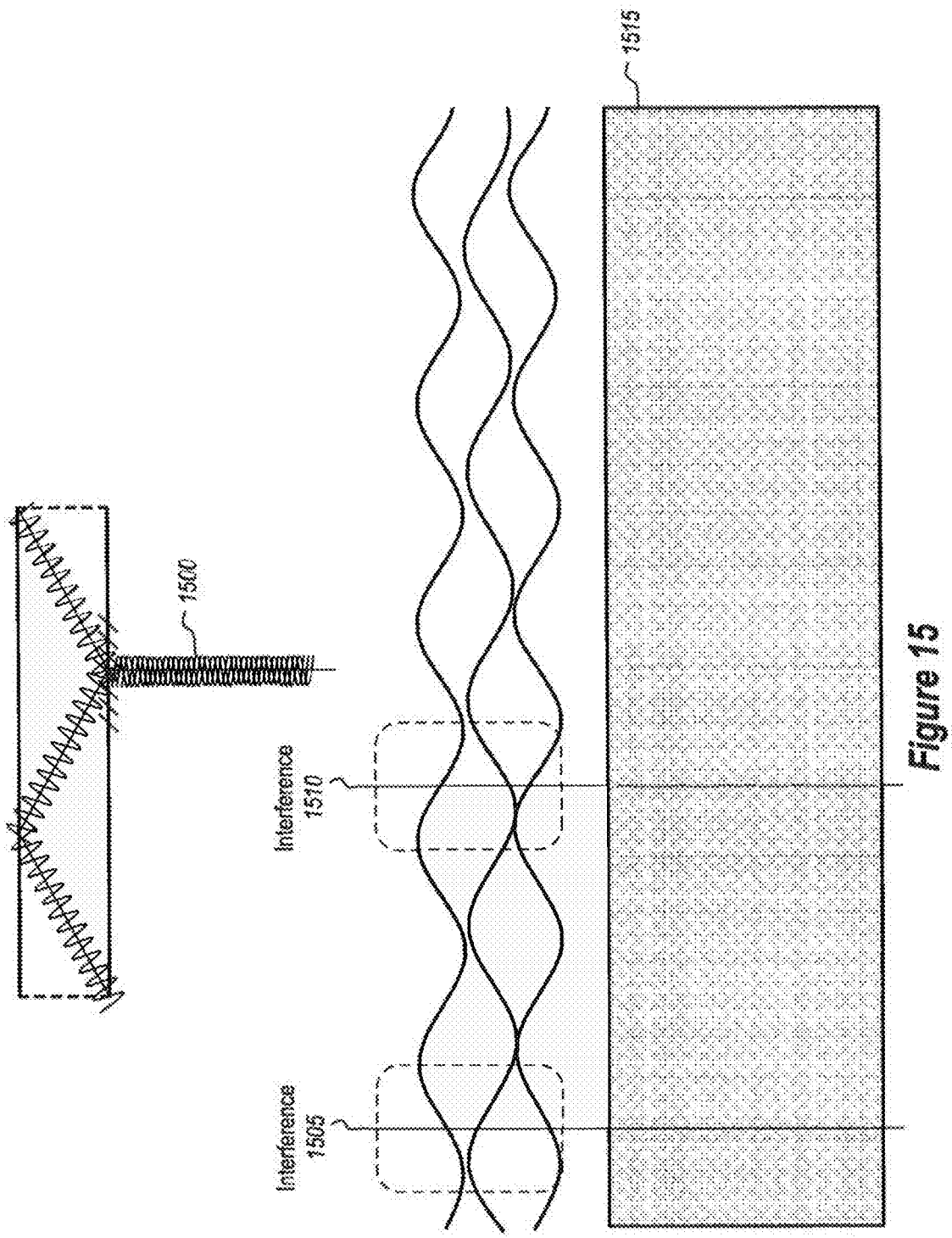
FIG. 15 illustrates properties of laser light that that has undergone spatial coherence (and spectral linewidth) modifications.

Attention is now directed to FIGS. 14 and 15, which illustrate views of a waveguide. These embodiments will be used to further demonstrate how the disclosed techniques for pulsing lasers having relatively low coherence and increased spectral linewidth can be beneficial, particularly for systems that render holographic content through surface relief gratings.

FIG. 14 shows a waveguide 1400 with an exit grating 1405. Waveguide 1400 and exit grating 1405 are representative of the waveguides and exit gratings that were discussed earlier. Also shown is laser light 1410 that has wavelike characteristics and that is propagating through waveguide 1400. Similar to the disclosure presented earlier, some portions of laser light 1410 will leave waveguide 1400 via exit grating 1405. Additionally, some portions of laser light 1410 will back-scatter or continue to reflect in waveguide 1400, as shown by laser light 1415. In some instances, laser light 1415 will eventually leave waveguide 1400 via exit grating 1405.

Because the spectral linewidth of the laser light 1410 and 1415 has been broadened, the resulting laser light 1420 interferes with itself much more than the laser light 720 or 800 from FIGS. 7 and 8, respectively. As a result of this increased interference, the combination of the laser light 1410 and 1415 will not constructively and destructively add to create the bright and dark artifacts. Instead, the resulting laser light 1420 is less coherent, thereby preventing the generation of the visual artifacts.

FIG. 15 shows an example of why this occurs. Here, there is resulting laser light 1500 which is representative of the resulting laser light 1420 from FIG. 14. Although different laser light reflections are merged together or otherwise interfere with each other (e.g., interference 1505 and interference 1510), the combination of these interferences does not result in a constructive wave. Instead, the combination of the laser light results in a smooth illumination 1515 that does not include the dark and bright spots discussed in connection with FIG. 8. As such, it is highly beneficial to broaden the spectral linewidth of a laser when the laser is being used to render holographic content. By performing a broadening operation, the embodiments eliminate the occurrence of artifacts and thereby significantly improve the user's experience.

In some embodiments, the holographic display supports foveated rendering such that some areas of the display will have a higher resolution (or resolution requirement) than other areas of the display. Accordingly, in some embodiments, selected pixels (but not all pixels in the display) may be illuminated or irradiated by the RGB lasers for different pre-selected periods of pulse time. As such, the pre-selected periods of time may be based, at least in part, on a location of a pixel in the display's field of view. Additionally, some embodiments support eye tracking to determine which selected portions of the display (which pixels) are to be rendered by pulsed lasers having the decreased coherence and increased spectral linewidth and for which periods of time during the image rendering. Therefore, the pre-selected periods of time may be based on where the user's eye is directed as opposed to a location on the display's field of view. Even further, some embodiments cause the pre-selected period of time to be based on a desired image resolution for the holographic image (i.e. an AR or VR image). Combinations of the above features are also possible.

Example Methods

Attention will now be directed to FIGS. 16A, 16B, 17, and 18 which refer to a number of method acts that may be performed. Although the method acts may be discussed in a certain order or illustrated in a flowchart as occurring in a particular order, no particular ordering is required unless specifically stated, or required because an act is dependent on another act being completed prior to the act being performed.

Figure 16A:
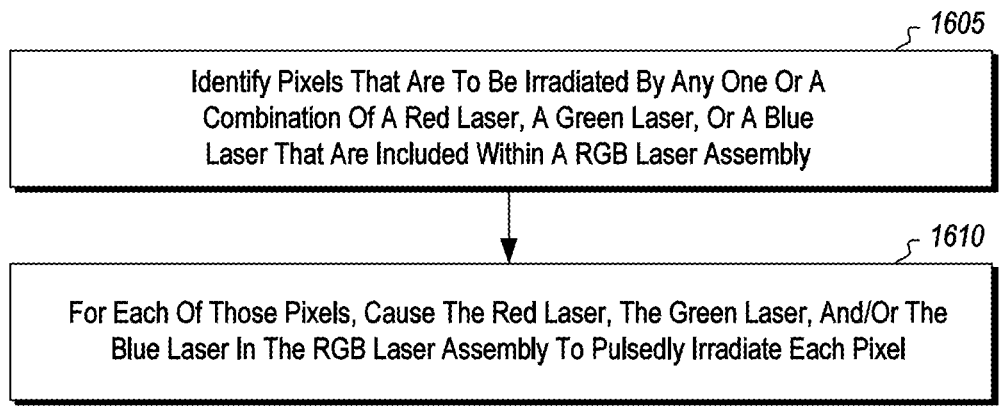
FIGS. 16A and 16B illustrate a flowchart of acts associated with methods for improving the quality of images that are projected in an AR or VR environment with an RGB laser assembly.

FIG. 16A illustrates a flowchart 1600 of a method for improving image quality when a red, green, blue (RGB) laser assembly is used to display an image in a mixed-reality environment. This method may be performed by any kind of computing system (e.g., the computer system described later in FIG. 19) that includes the RGB laser assembly.

Initially, a set of one or more pixels are identified (act 1605). These pixels are to be irradiated by any one or a combination of a red laser, a green laser, or a blue laser that are included in the RGB laser assembly. In some embodiments, the pixels will be irradiated by multiple red lasers, and/or multiple green lasers, and/or multiple blue lasers. In other embodiments some pixels are illuminated by one of the red, green, or blue lasers, while other pixels are illuminated by other red, green, or blue lasers. Furthermore, the pixels may be irradiated simultaneously by these multiple red, green, and blue lasers.

Figure 16B:
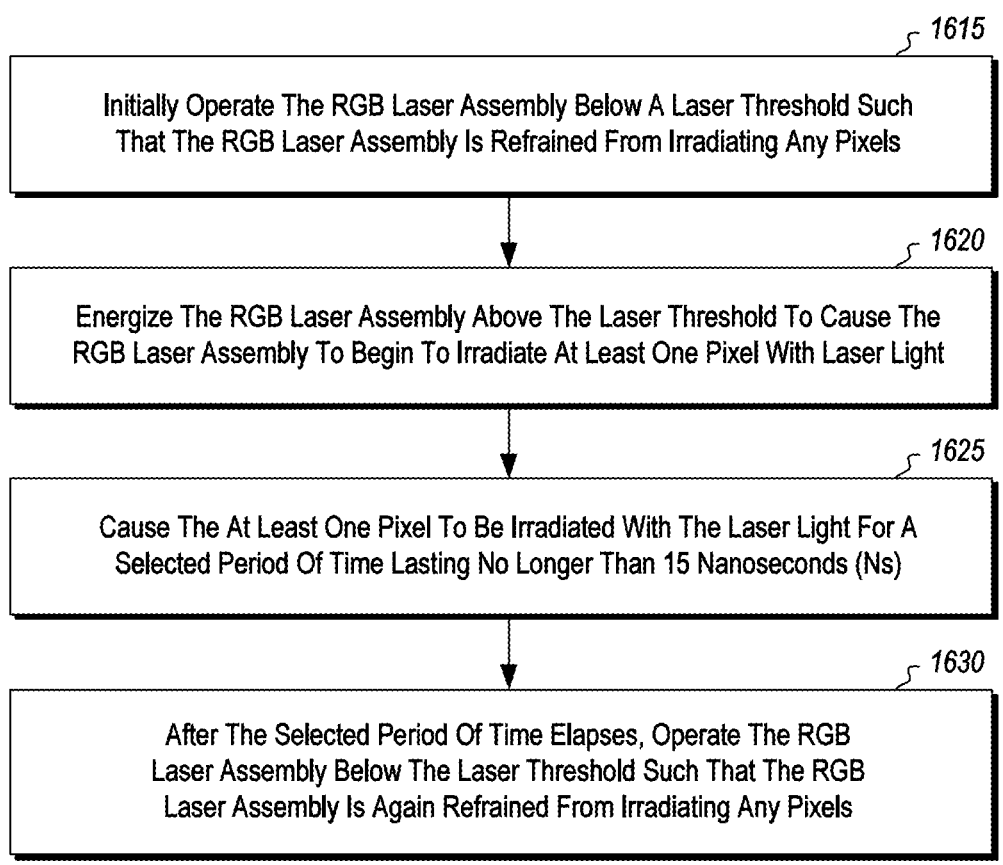

Then, for each of these pixels, the red, green, and/or blue lasers in the RGB laser assembly are caused to pulsedly irradiate each of the pixels (act 1610). FIG. 16B provides further description on how this act may be performed. For instance, FIG. 16B continues the flowchart 1600 by showing a number of additional acts that may be performed to irradiate the pixels.

Initially, the RGB laser assembly is operated below a laser threshold (act 1615). As a result of this operation, the RGB laser assembly is refrained from irradiating any pixels.

Subsequently, the RGB laser assembly is energized above the laser threshold (act 1620). This action causes the RGB laser assembly to begin to irradiate at least one pixel with laser light.

In connection with the above acts, there is also an act (act 1625) of causing the irradiated pixel to be irradiated with the laser light for a selected period of time lasting no longer than 15 nanoseconds (ns). Additionally, while the pixel is being irradiated with the laser light, an intensity of the laser light is set to not exceed a pre-determined optical power level (e.g., based on the resolution requirement associated with the pixel and/or other attributes for that particular pixel).

After the selected period of time elapses, the RGB laser assembly is caused to again operate below the laser threshold (act 1630). Consequently, the RGB laser assembly is again refrained from irradiating any pixels with laser light.

Figure 17:
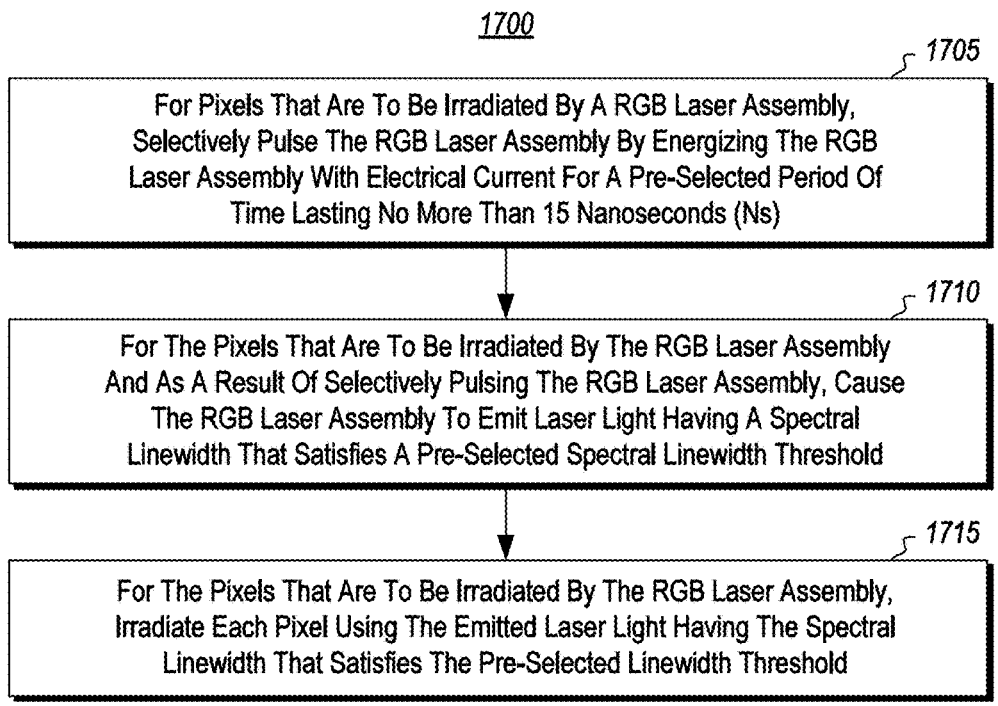
FIG. 17 illustrates another flowchart of acts associated with methods for improving image quality that utilizes an RGB laser assembly.

FIG. 17 shows a flowchart 1700 of an example method for improving virtual content when a RGB laser assembly is used to project holograms/holographic content. First, the RGB laser is selectively pulsed to irradiate some pixels (act 1705). Here, this pulsing operation is performed by energizing the RGB laser assembly with electrical current for a pre-selected period of time lasting no longer than 15 ns. In this manner, the red laser, green laser, and/or blue laser is biased so that they emit structured laser light.

As a result of pulsing the RGB laser assembly, the RGB laser assembly is caused to emit laser light (act 1710). Here, this laser light is specially structured to have a spectral linewidth that satisfies a pre-selected spectral linewidth threshold, as described earlier.

As a result of performing the above method acts, each pixel is then irradiated using the emitted laser light (act 1715). Consequently, the pixels are illuminated with laser light having a spectral linewidth that satisfies the pre-selected linewidth threshold.

Figure 18:
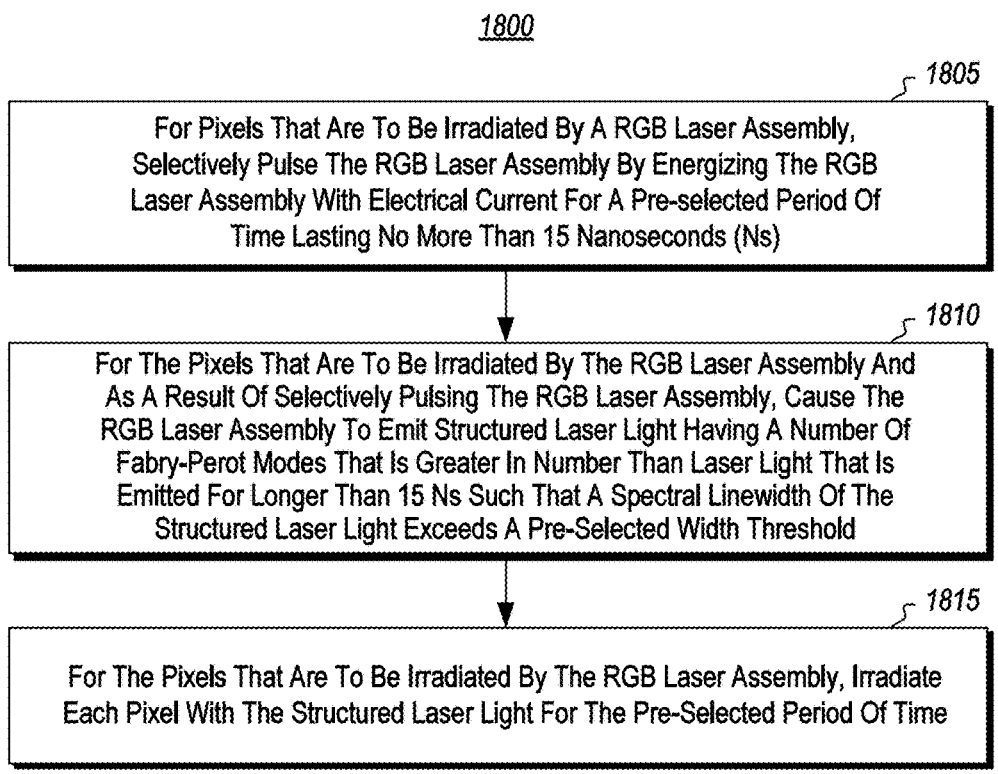
FIG. 18 illustrates another flowchart of acts associated with methods for improving image quality that utilizes an RGB laser assembly.

FIG. 18 shows another flowchart 1800 of an example method for improving holographic image quality when a RGB laser assembly is used to display AR or VR image content. Initially, the RGB laser assembly is selectively pulsed (act 1805). This pulsing operation is performed for each of at least some pixels that are selected to be irradiated with laser light. Furthermore, the operation of selectively pulsing the RGB laser assembly is performed by energizing the RGB laser assembly with electrical current for a pre-selected period of time. In some embodiments, this period of time lasts no longer than 15 ns.

For those pixels that are to be irradiated, the RGB laser assembly is caused to emit structured laser light (act 1810). This structured laser light is configured to have a number of Fabry-Perot modes that is greater in number than laser light that is emitted for longer than 15 ns. As a result of using laser light with a larger number of modes, the spectral linewidth of the structured laser light exceeds a pre-selected width threshold (e.g., 1.5 nm in wavelength as measured by the full-width-half-maximum intensity).

Additionally, each of the pixels are irradiated with the structured laser light for the pre-selected period of time (act 1815). In other words, the pixels are irradiated for no longer than 15 ns.

It will be appreciated that the foregoing methods will also be implemented, in some embodiments, in coordination with the scanning of the MEMs during the rendering of holograms and other images to selectively affect the desired pixels of the rendered images and to negate the creation of undesired artifacts.

Accordingly, the disclosed embodiments provide an unanticipated solution to problems related to using RGB lasers to render virtual content. In particular, the disclosed embodiments cause the RGB lasers to operate in a short, pulsed mode when illuminating an individual pixel or a group of pixels. While operating in this pulsed mode or state, the RGB lasers emit laser light for a period of time spanning less than 15 ns (hence the use of the term "pulsed"). Once the emission time period elapses, then the RGB lasers no longer emit laser light such that they operate in a non-emitting mode or state for a different period of time. Subsequently, the RGB lasers will be used to emit another pixel(s) in a pulsed manner. As a result, a hologram is progressively scanned or rendered by chirping/pulsing the RGB lasers. In this manner, the disclosed embodiments are able to reduce/eliminate the presence or occurrence of visual artifacts by operating the RGB lasers in a pulsed mode, which causes the resulting laser light to have a relatively larger/broader spectral linewidth than what would conventionally be used in a hologram-creation scenario.

Example Computer System

Figure 19:
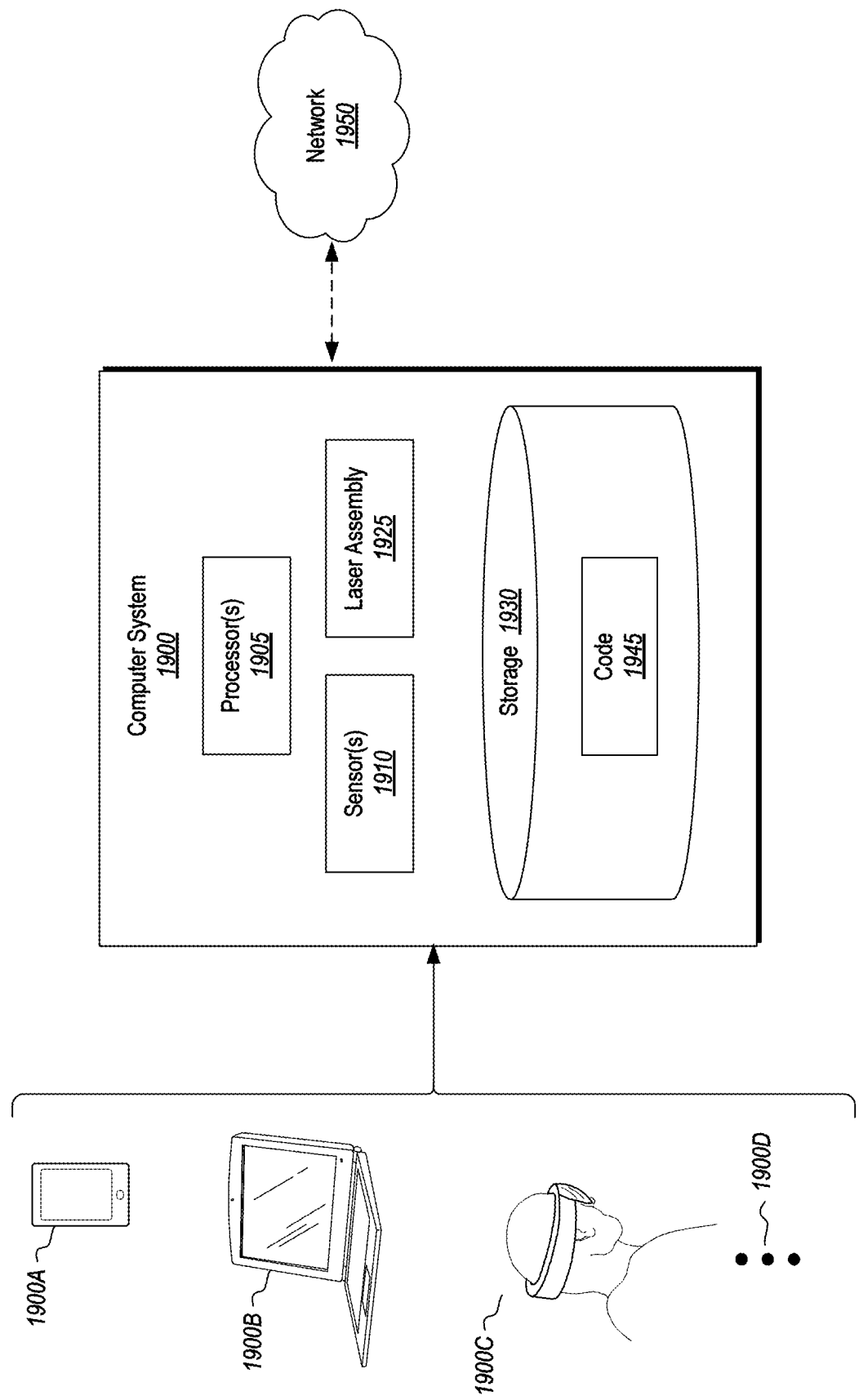
FIG. 19 illustrates an example of a computer system that may be utilized to perform the disclosed methods.

Having just described the various features and functionalities of some of the disclosed embodiments, the focus will now be directed to FIG. 19 which illustrates an example computer system 1900 that may be used to facilitate the operations described herein. In particular, this computer system 1900 may be in the form of the HMDs that were described earlier. When in the form of a HMD, then the computer system may be an augmented-reality system or a virtual-reality system.

The computer system 1900 may take various different forms. For example, in FIG. 19, the computer system 1900 may be embodied as a tablet 1900A, a desktop 1900B, or a HMD 1900C. The ellipsis 1900D demonstrates that the computer system 1900 may be embodied in any form. For example, the computer system 1900 may also be a distributed system that includes one or more connected computing components/devices that are in communication with the computer system 1900, a laptop computer, a mobile phone, a server, a data center, and/or any other computer system.

In its most basic configuration, computer system 1900 includes various different components. For example, FIG. 19 shows that computer system 1900 includes at least one processor 1905 (e.g., a "hardware processing unit"), sensors 1910, a laser assembly 1925 (such as described throughout this disclosure), and storage 1930. The storage 1930 is shown as including code 1945 (which is code that is executable by the processors to implement the disclosed functionality).

As discussed earlier, the computer system 1900 may also include a MEMs system, or any other type of laser-based hologram projection unit. When a MEMs system is present, then the MEMs system operates in conjunction with the RGB laser assembly along with a waveguide (e.g., a surface relief grating waveguide) to display virtual or holographic images and may be part of the illustrated laser assembly 1925.

The storage 1930 may be physical system memory, which may be volatile, non-volatile, or some combination of the two. The term "memory" may also be used herein to refer to non-volatile mass storage such as physical storage media. If the computer system 1900 is distributed, the processing, memory, and/or storage capability may be distributed as well. As used herein, the term "executable module," "executable component," or even "component" can refer to software objects, routines, or methods that may be executed on the computer system 1900. The different components, modules, engines, and services described herein may be implemented as objects or processors that execute on the computer system 1900 (e.g. as separate threads).

The disclosed embodiments may comprise or utilize a special-purpose or general-purpose computer including computer hardware, such as, for example, one or more processors (such as processor 1905) and system memory (such as storage 1930), as discussed in greater detail below. Embodiments also include physical and other computer-readable media for carrying or storing computer-executable instructions and/or data structures. Such computer-readable media can be any available media that can be accessed by a general-purpose or special-purpose computer system. Computer-readable media that store computer-executable instructions in the form of data are physical computer storage media. Computer-readable media that carry computer-executable instructions are transmission media. Thus, by way of example and not limitation, the current embodiments can comprise at least two distinctly different kinds of computer-readable media: computer storage media and transmission media.

Computer storage media are hardware storage devices, such as RAM, ROM, EEPROM, CD-ROM, solid state drives (SSDs) that are based on RAM, Flash memory, phase-change memory (PCM), or other types of memory, or other optical disk storage, magnetic disk storage or other magnetic storage devices, or any other medium that can be used to store desired program code means in the form of computer-executable instructions, data, or data structures and that can be accessed by a general-purpose or special-purpose computer.

The computer system 1900 may also be connected (via a wired or wireless connection) to external sensors (e.g., one or more remote cameras, accelerometers, gyroscopes, acoustic sensors, magnetometers, etc.). Further, the computer system 1900 may also be connected through one or more wired or wireless networks 1950 to remote systems(s) that are configured to perform any of the processing described with regard to computer system 1900.

During use, a user of the computer system 1900 is able to perceive information (e.g., a mixed-reality environment) through a display screen that is included among any I/O interface(s) and that is visible to the user. The I/O interface(s) and sensors 1910 also include gesture detection devices, eye trackers, and/or other movement detecting components (e.g., cameras, gyroscopes, accelerometers, magnetometers, acoustic sensors, global positioning systems ("GPS"), etc.) that are able to detect positioning and movement of one or more real-world objects, such as a user's hand, a stylus, and/or any other object(s) that the user may interact with while being immersed in the scene.

A graphics rendering engine may also be configured, with the processor 1905, to render one or more virtual objects within a mixed-reality scene/environment. As a result, the virtual objects accurately move in response to a movement of the user and/or in response to user input as the user interacts within the virtual scene.

A "network," like the network 1950 shown in FIG. 19, is defined as one or more data links and/or data switches that enable the transport of electronic data between computer systems, modules, and/or other electronic devices. When information is transferred, or provided, over a network (either hardwired, wireless, or a combination of hardwired and wireless) to a computer, the computer properly views the connection as a transmission medium. The computer system 1900 will include one or more communication channels that are used to communicate with the network 1950. Transmissions media include a network that can be used to carry data or desired program code means in the form of computer-executable instructions or in the form of data structures. Further, these computer-executable instructions can be accessed by a general-purpose or special-purpose computer. Combinations of the above should also be included within the scope of computer-readable media.

Upon reaching various computer system components, program code means in the form of computer-executable instructions or data structures can be transferred automatically from transmission media to computer storage media (or vice versa). For example, computer-executable instructions or data structures received over a network or data link can be buffered in RAM within a network interface module (e.g., a network interface card or "NIC") and then eventually transferred to computer system RAM and/or to less volatile computer storage media at a computer system. Thus, it should be understood that computer storage media can be included in computer system components that also (or even primarily) utilize transmission media.

Computer-executable (or computer-interpretable) instructions comprise, for example, instructions that cause a general-purpose computer, special-purpose computer, or special-purpose processing device to perform a certain function or group of functions. The computer-executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the embodiments may be practiced in network computing environments with many types of computer system configurations, including personal computers, desktop computers, laptop computers, message processors, hand-held devices, multi-processor systems, microprocessor-based or programmable consumer electronics, network PCs, minicomputers, mainframe computers, mobile telephones, PDAs, pagers, routers, switches, and the like. The embodiments may also be practiced in distributed system environments where local and remote computer systems that are linked (either by hardwired data links, wireless data links, or by a combination of hardwired and wireless data links) through a network each perform tasks (e.g. cloud computing, cloud services and the like). In a distributed system environment, program modules may be located in both local and remote memory storage devices.

Additionally, or alternatively, the functionality described herein can be performed, at least in part, by one or more hardware logic components (e.g., the processor 1905). For example, and without limitation, illustrative types of hardware logic components that can be used include Field-Programmable Gate Arrays (FPGAs), Program-Specific or Application-Specific Integrated Circuits (ASICs), Program-Specific Standard Products (ASSPs), System-On-A-Chip Systems (SOCs), Complex Programmable Logic Devices (CPLDs), Central Processing Units (CPUs), and other types of programmable hardware.

The present invention may be embodied in other specific forms without departing from its spirit or characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method for modifying operation of a red, green, blue (RGB) laser assembly used for creating images in a mixed-reality environment in order to increase a spectral linewidth of laser light that is emitted by the RGB laser assembly, the method being performed by a computer system that includes the RGB laser assembly, the method comprising:
   identifying a set of one or more pixels that are to be irradiated by any one or a combination of one or more red lasers, one or more green lasers, or one or more blue lasers that are included within the RGB laser assembly;
   for each pixel in the set of one or more pixels, cause the any one or the combination of the one or more red lasers, the one or more green lasers, or the one or more blue lasers in the RGB laser assembly to pulsedly irradiate each pixel by performing at least the following:
      initially operating the RGB laser assembly below a laser threshold such that the RGB laser assembly is refrained from irradiating any pixels in the set of one or more pixels;
      energizing the RGB laser assembly above the laser threshold to cause the RGB laser assembly to begin to irradiate at least one pixel in the set of one or more pixels with laser light;
      causing the at least one pixel to be irradiated with the laser light for a selected period of time lasting no longer than 15 nanoseconds (ns), wherein, while the at least one pixel is irradiated with the laser light, an intensity of the laser light is set to not exceed a pre-determined optical power level, and wherein the laser light is structured to have a number of Fabry-Perot modes that is greater in number than laser light that is emitted for longer than 15 ns; and
      after the selected period of time elapses, operating the RGB laser assembly below the laser threshold such that the RGB laser assembly is again refrained from irradiating any pixels.

2. The method of claim 1, wherein the selected period of time is 8 ns such that the any one or the combination of the one or more red lasers, the one or more green lasers, or the one or more blue lasers in the RGB laser assembly is selectively pulsed for 8 ns or less.

3. The method of claim 1, wherein causing the any one or the combination of the one or more red lasers, the one or more green lasers, or the one or more blue lasers in the RGB laser assembly to irradiate each pixel is also performed by biasing the RGB laser assembly above the laser threshold when pixels are to be irradiated and biasing the RGB laser assembly below the laser threshold when pixels are not to be irradiated such that the RGB laser assembly operates in a lower power mode when not irradiating pixels.

4. The method of claim 1, wherein a spectral linewidth of the laser light satisfies a pre-selected width threshold of 1.5 nm in wavelength such that the spectral linewidth is at least 1.5 nm in wavelength as measured by a full-width-half-maximum intensity.

5. The method of claim 1, wherein different pixels are associated with different selected periods of time, and wherein the different selected periods of time are based, at least in part, on a location of each corresponding pixel in a field of view of a display for the computer system.

6. The method of claim 1, wherein the computer system includes a micro-electromechanical mirror (MEMs) system such that the RGB laser assembly is used in conjunction with the MEMs system to display a holographic image.

7. The method of claim 1, wherein a holographic image is projected to an eye of a user who is using the computer system via a waveguide.

8. The method of claim 7, wherein the waveguide is a surface relief grating waveguide.

9. A method for controlling operation of a red, green, blue (RGB) laser assembly used for creating images in a mixed-reality environment in order to increase a spectral linewidth of laser light that is emitted by the RGB laser assembly, the method being performed by a computer system that includes the RGB laser assembly, the method comprising:
   for each of at least some pixels that are to be irradiated by the RGB laser assembly, selectively pulsing the RGB laser assembly by energizing the RGB laser assembly with electrical current for a pre-selected period of time lasting no more than 15 nanoseconds (ns);
   for each of the at least some pixels that are to be irradiated by the RGB laser assembly and as a result of selectively pulsing the RGB laser assembly, causing the RGB laser assembly to emit laser light having a spectral linewidth that satisfies a pre-selected spectral linewidth threshold, wherein, as a result of energizing the RGB laser assembly for no longer than 15 ns, the laser light is structured to have a number of Fabry-Perot modes that is greater in number than laser light that is emitted for longer than 15 ns; and for each of the at least some pixels that are to be irradiated by the RGB laser assembly, irradiating each pixel using the emitted laser light having the spectral linewidth that satisfies the pre-selected linewidth threshold.

10. The method of claim 9, wherein the pre-selected period of time is also based, at least in a part, on a desired image resolution for the AR or VR image.

11. The method of claim 9, where the RGB laser assembly is comprised of multiple red lasers, and/or multiple green lasers, and/or multiple blue lasers.

12. The method of claim 9, wherein the computer system further includes a microelectromechanical mirror (MEMS) assembly configured to scan laser light from the RGB laser assembly with a resolution of 2,000 pixels by 1,200 pixels.

13. The method of claim 9, wherein energizing the RGB laser assembly above the laser threshold constitutes a lasing period, and wherein pulsedly irradiating each pixel includes causing the RGB laser assembly to refrain from generating any stimulated emission of laser light in between lasing periods.

14. The method of claim 9, wherein the pre-selected period of time lasts from 1 ns up to or including 8 ns.

15. The method of claim 9, wherein the spectral linewidth is greater than 1.5 nm at full-width-half-maximum.

16. The method of claim 9, wherein the computer system is an augmented-reality computer system or a virtual-reality computer system.

17. A computer system configured to control operation of a red, green, blue (RGB) laser assembly used for creating images in a mixed-reality environment in order to increase a spectral linewidth of laser light that is emitted by the RGB laser assembly, said computer system comprising:

one or more processors; and one or more computer-readable hardware storage devices having stored thereon computer-executable instructions that are executable by the one or more processors to cause the computer system to at least:

for each of at least some pixels that are to be irradiated by the RGB laser assembly, selectively pulse the RGB laser assembly by energizing the RGB laser assembly with electrical current for a pre-selected period of time lasting no more than 15 nanoseconds (ns);

for each of the at least some pixels that are to be irradiated by the RGB laser assembly and as a result of selectively pulsing the RGB laser assembly, cause the RGB laser assembly to emit structured laser light having a number of Fabry-Perot modes that is greater in number than laser light that is emitted for longer than 15 ns such that a spectral linewidth of the structured laser light exceeds a pre-selected width threshold; and for each of the at least some pixels that are to be irradiated by the RGB laser assembly, irradiate each pixel with the structured laser light for the pre-selected period of time.

18. The computer system of claim 17, wherein the computer system includes a micro-electromechanical mirror (MEMs) system such that the RGB laser assembly is used in conjunction with the MEMs system and a surface relief grating to display a virtual image.

19. The computer system of claim 17, wherein:
the pre-selected period of time is between 1 ns and 8 ns,
causing the RGB laser assembly to emit the laser light constitutes a lasing period, and
the RGB laser assembly is refrained from emitting laser light in between lasing periods for a determined time period.

20. The computer system of claim 17, wherein a holographic image is projected to an eye of a user who is using the computer system via a waveguide.

* * * * *